United States Patent
Sung et al.

(10) Patent No.: US 10,505,073 B2
(45) Date of Patent: Dec. 10, 2019

(54) SEMICONDUCTOR LIGHT EMITTING DEVICE INCLUDING FLOATING CONDUCTIVE PATTERN

(71) Applicant: SAMSUNG ELECTRONICS CO., LTD., Suwon-si, Gyeonggi-do (KR)

(72) Inventors: Young Kyu Sung, Hwaseong-si (KR); Jae Yoon Kim, Yongin-si (KR); Tae Hun Kim, Bucheon-si (KR); Gam Han Yong, Hwaseong-si (KR); Dong Yeoul Lee, Suwon-si (KR); Su Yeol Lee, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/725,438

(22) Filed: Oct. 5, 2017

(65) Prior Publication Data
US 2018/0198022 A1    Jul. 12, 2018

(30) Foreign Application Priority Data

Jan. 12, 2017    (KR) .................. 10-2017-0005361

(51) Int. Cl.
| | |
|---|---|
| *H01L 33/08* | (2010.01) |
| *H01L 33/38* | (2010.01) |
| *H01L 25/075* | (2006.01) |
| *H01L 33/20* | (2010.01) |
| *H01L 33/46* | (2010.01) |

(52) U.S. Cl.
CPC .......... *H01L 33/08* (2013.01); *H01L 25/0753* (2013.01); *H01L 33/382* (2013.01); *H01L 33/20* (2013.01); *H01L 33/46* (2013.01)

(58) Field of Classification Search
CPC ....... H01L 33/08; H01L 33/382; H01L 33/46; H01L 33/20; H01L 25/0753
USPC ........................................................... 257/93
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |

(Continued)

OTHER PUBLICATIONS https://www.merriam-webster.com/dictionary/along; 2018.*

*Primary Examiner* — Nilufa Rahim
(74) *Attorney, Agent, or Firm* — Lee & Morse, P.C.

(57) ABSTRACT

A semiconductor light emitting device including a floating conductive pattern is provided. The semiconductor light emitting device includes a first semiconductor layer including a recessed region and a protruding region, an active layer and a second semiconductor layer disposed on the protruding region, a contact structure disposed on the second semiconductor layer, a lower insulating pattern covering the first semiconductor layer and the contact structure, and having first and second openings, a first conductive pattern disposed on the lower insulating pattern and extending into the first opening, a second conductive pattern disposed on the lower insulating pattern and extending into the second opening, and a floating conductive pattern disposed on the lower insulating pattern. The first and second conductive patterns and the floating conductive pattern have the same thickness on the same plane.

19 Claims, 20 Drawing Sheets

(56) References Cited

U.S. PATENT DOCUMENTS

| | | |
|---|---|---|
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,015,512 B2 | 3/2006 | Park et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,236,524 B2 | 1/2016 | Jeon et al. |
| 9,397,266 B2 | 7/2016 | Donofrio et al. |
| 2013/0328096 A1 | 12/2013 | Donofrio et al. |
| 2015/0171298 A1* | 6/2015 | Cho ................ H01L 33/38 257/98 |
| 2015/0270448 A1 | 9/2015 | Chyu et al. |
| 2016/0111614 A1 | 4/2016 | Lee et al. |
| 2017/0084787 A1* | 3/2017 | Emura ............ H01L 33/387 |
| 2017/0186915 A1* | 6/2017 | Emura ............ H01L 27/156 |
| 2018/0062047 A1* | 3/2018 | Biwa ............... H01L 33/46 |

\* cited by examiner

SEMICONDUCTOR LIGHT EMITTING DEVICE INCLUDING FLOATING CONDUCTIVE PATTERN

CROSS-REFERENCE TO RELATED APPLICATION(S)

Korean Patent Application No. 10-2017-0005361, filed on Jan. 12, 2017, in the Korean Intellectual Property Office, and entitled: "Semiconductor Light Emitting Device Including Floating Conductive Pattern," is incorporated by reference herein in its entirety.

BACKGROUND

1. Field

The present disclosure relates to a light emitting device, and more particularly, to a semiconductor light emitting device including a floating conductive pattern.

2. Description of the Related Art

Semiconductor light emitting devices have been known as next generation light sources having many positive attributes, e.g., relatively long lifespans, low power consumption, rapid response rates, environmentally friendly characteristics, and the like. The semiconductor light emitting devices have been used as important light sources in various products, e.g., lighting devices, backlight units of display devices, and the like.

SUMMARY

According to an aspect of the present disclosure, a semiconductor light emitting device includes a first semiconductor layer including a recessed region and a protruding region; an active layer and a second semiconductor layer sequentially stacked on the protruding region of the first semiconductor layer; a contact structure disposed on the second semiconductor layer; a lower insulating pattern covering the first semiconductor layer and the contact structure, and having a first opening exposing a contact region of the first semiconductor layer and a second opening exposing a contact region of the contact structure; a first conductive pattern disposed on the lower insulating pattern and extending into the first opening of the lower insulating pattern to be electrically connected to the contact region of the first semiconductor layer; a second conductive pattern disposed on the lower insulating pattern and extending into the second opening of the lower insulating pattern to be electrically connected to the contact structure; and a floating conductive pattern disposed on the lower insulating pattern and spaced apart from the first conductive pattern. The first and second conductive patterns and the floating conductive pattern have the same thickness as each other on the same plane.

According to an aspect of the present disclosure, a semiconductor light emitting device includes a first semiconductor layer including a first region and a second region, and including a first corner, a second corner, a third corner, and a fourth corner sequentially arranged in a counterclockwise direction when viewed from above; an active layer and a second semiconductor layer sequentially stacked on the second region of the first semiconductor layer; a contact structure disposed on the second semiconductor layer; a lower insulating pattern covering the first semiconductor layer and the contact structure, and having a first opening exposing a contact region of the first semiconductor layer and a second opening exposing a contact region of the contact structure; and a first conductive pattern, a second conductive pattern and a floating conductive pattern, disposed on the lower insulating pattern and spaced apart from each other. The first and second conductive patterns and the floating conductive pattern have the same thickness as each other on the same plane. The first conductive pattern extends into the first opening of the lower insulating pattern to be electrically connected to the contact region of the first semiconductor layer. The second conductive pattern extends into the second opening of the lower insulating pattern to be electrically connected to the contact structure. The floating conductive pattern includes portions disposed between the first and second corners and the first conductive pattern.

According to an aspect of the present disclosure, a semiconductor light emitting device includes a first semiconductor layer including a recessed region and a protruding region; an active layer and a second semiconductor layer sequentially stacked on the protruding region of the first semiconductor layer; a contact structure disposed on an upper surface of the second semiconductor layer; a lower insulating pattern covering the first semiconductor layer and the contact structure, and having a first opening exposing a contact region of the first semiconductor layer and a second opening exposing a contact region of the contact structure; a first conductive pattern disposed on the lower insulating pattern and extending into the first opening of the lower insulating pattern to be electrically connected to the contact region of the first semiconductor layer; a second conductive pattern disposed on the lower insulating pattern and extending into the second opening of the lower insulating pattern to be electrically connected to the contact structure; a floating conductive pattern disposed on the lower insulating pattern and spaced apart from the first conductive pattern. The first and second conductive patterns and the floating conductive pattern have the same thickness as each other on the same plane.

According to an aspect of the present disclosure, a semiconductor light emitting device includes a first semiconductor layer including a recessed region and a protruding region, an active layer and a second semiconductor layer sequentially stacked on the protruding region of the first semiconductor layer, a contact structure on the second semiconductor layer, a lower insulating pattern covering the first semiconductor layer and the contact structure, the lower insulating pattern having a first opening exposing a contact region of the first semiconductor layer and a second opening exposing a contact region of the contact structure, a first conductive pattern on the lower insulating pattern and extending into the first opening of the lower insulating pattern to be electrically connected to the contact region of the first semiconductor layer, a second conductive pattern on the lower insulating pattern and extending into the second opening of the lower insulating pattern to be electrically connected to the contact structure, a floating conductive pattern on the lower insulating pattern and spaced apart from the first conductive pattern, and an upper insulating pattern covering the first and second conductive patterns and the floating conductive pattern, the floating conductive pattern being enclosed by the lower and upper insulating patterns.

BRIEF DESCRIPTION OF DRAWINGS

Features will become apparent to those of ordinary skill in the art by describing in detail exemplary embodiments with reference to the attached drawings, in which.

DETAILED DESCRIPTION

Figure 1:
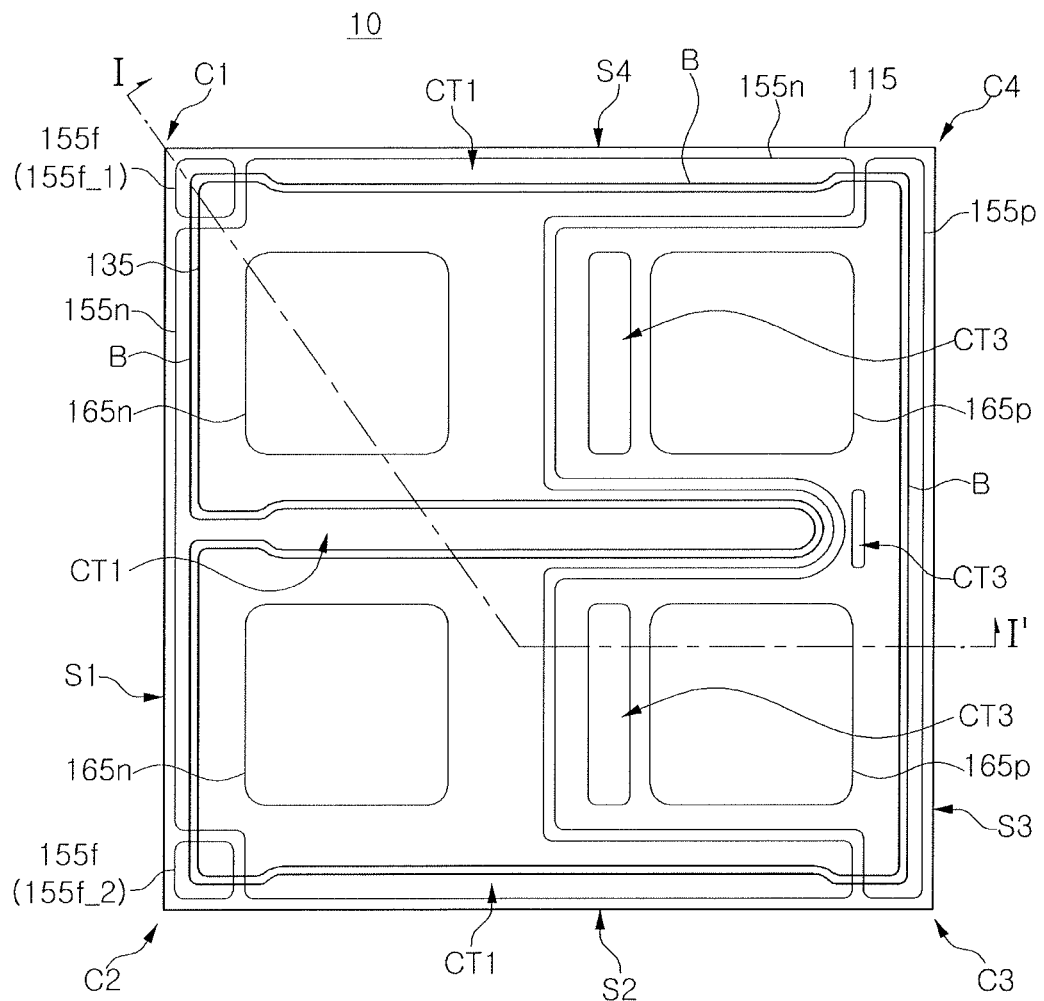
FIG. 1 illustrates a schematic plan view of a semiconductor light emitting device according to an embodiment.
Figure 2A:
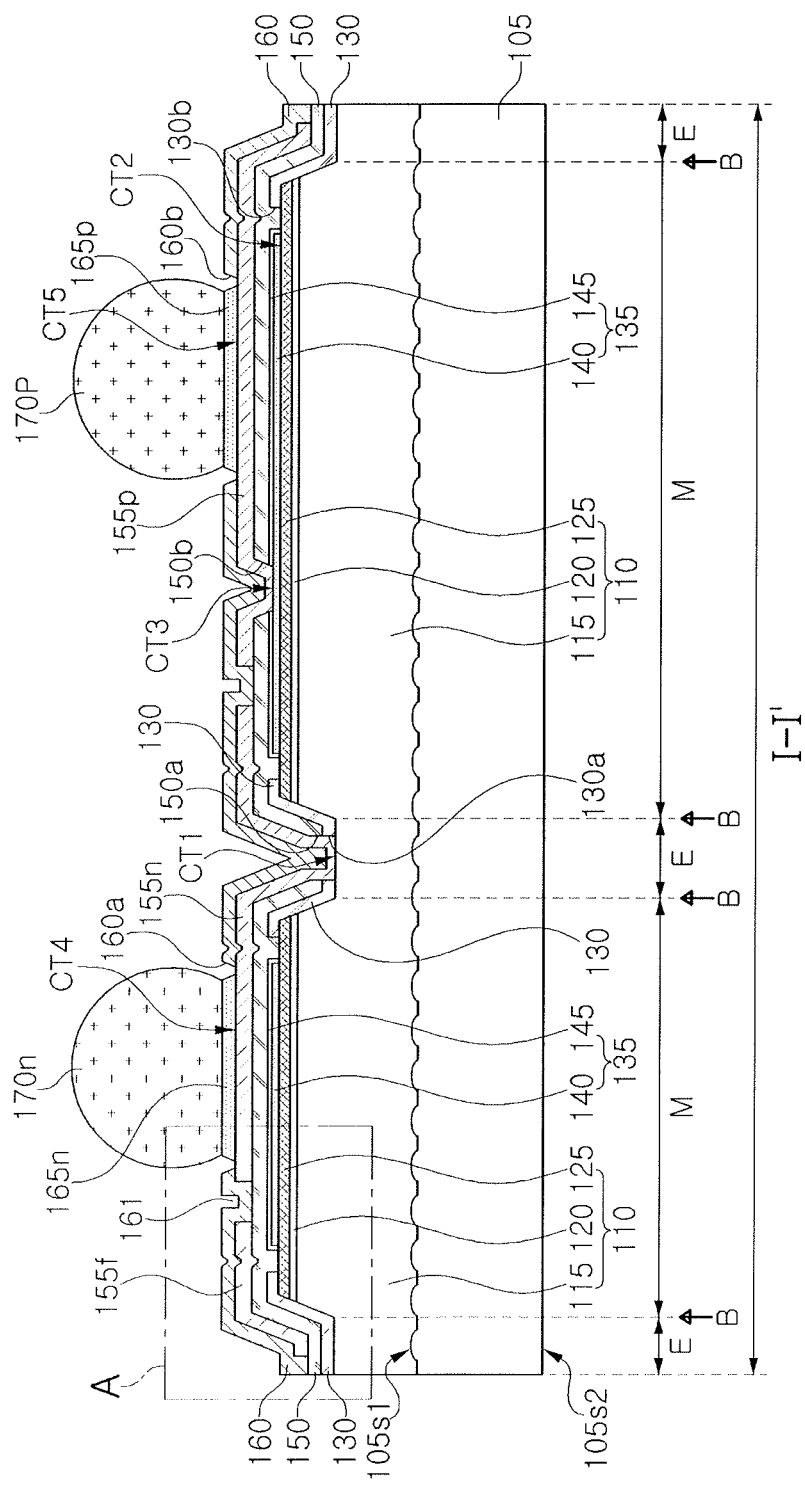
FIG. 2A illustrates a cross-sectional view of a region along line I-I' of FIG. 1.
Figure 2B:
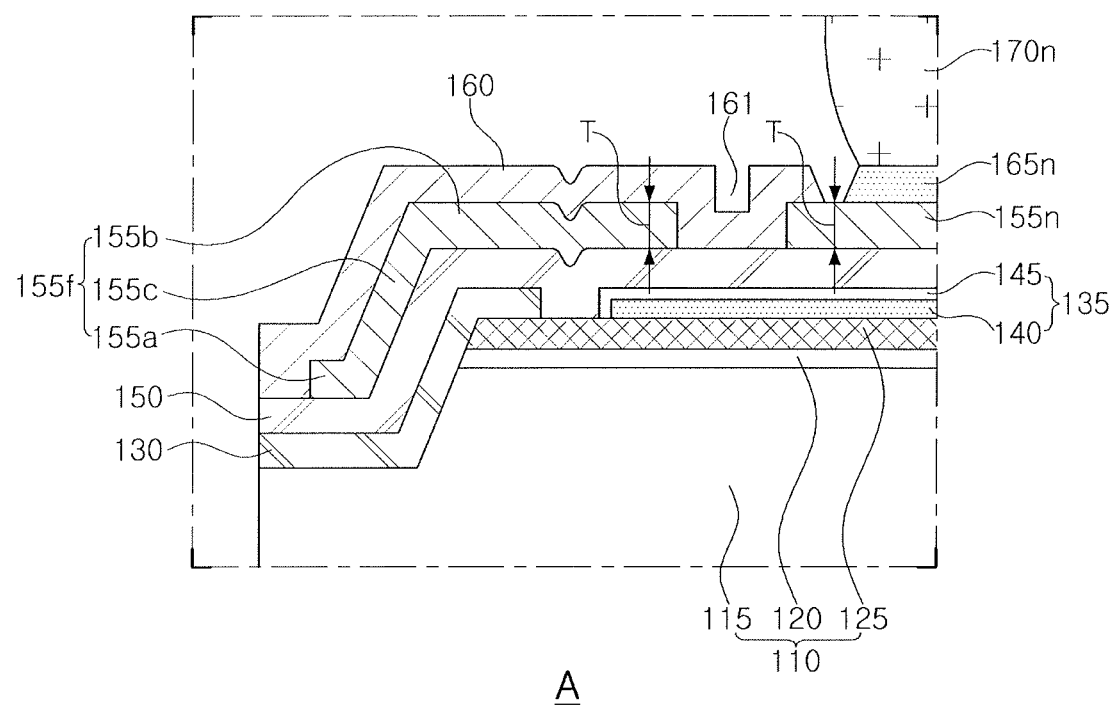
FIG. 2B illustrates an enlarged view of portion A of FIG. 2A.
Figure 2C:
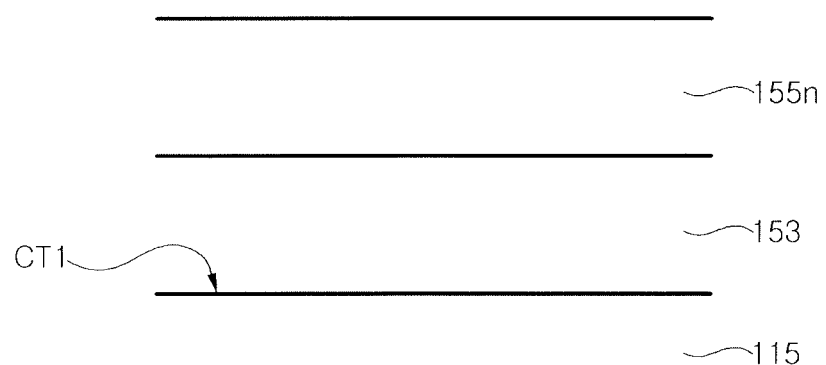
FIG. 2C illustrates a partial, enlarged view of a modified example of a semiconductor light emitting device according to an embodiment.

FIG. 1 is a schematic plan view of a semiconductor light emitting device 10 according to an embodiment, FIG. 2A is a cross-sectional view along line I-I' of FIG. 1, and FIG. 2B is an enlarged view of portion A of FIG. 2A. FIG. 2C is an enlarged view schematically illustrating a modified example of the semiconductor light emitting device 10 according to an embodiment. First, an example of the semiconductor light emitting device 10 according to an embodiment will be described with reference to FIGS. 1, 2A, and 2B.

With reference to FIGS. 1, 2A, and 2B, the semiconductor light emitting device 10 according to an embodiment may include a substrate 105, a light emitting structure 110, a passivation layer 130, a lower insulating pattern 150, an upper insulating pattern 160, a contact structure 135, a first conductive pattern 155$n$, a second conductive pattern 155$p$, a floating conductive pattern 155$f$, first and second electrodes 165$n$ and 165$p$, and first and second connection structures 170$n$ and 170$p$.

As illustrated in FIG. 2A, the substrate 105 may have a front surface 105$s$1 and a rear surface 105$s$2 opposing the front surface 105$s$1. The substrate 105 may be a semiconductor growth substrate and may be formed of an insulating, conductive, or semiconductor material, e.g., sapphire, silicon (Si), silicon carbide (SiC), $MgAl_2O_4$, MgO, $LiAlO_2$, $LiGaO_2$, GaN, or the like. The sapphire may have electrical insulation properties, may be a crystal having Hexa-Rhombo R3c symmetry, and may be used as a nitride semiconductor growth substrate.

Throughout the specification, the terms 'front surface', 'rear surface,' and the like are used to distinguish relative positions of components, and example embodiments of the present disclosure are not limited by these terms. Thus, the terms, such as 'front surface, 'rear surface' and like, may be used interchangeably with terms such as 'first surface,' second surface', and the like, in order to describe elements in example embodiments of the present disclosure. Thus, the front surface 105$s$1 and the rear surface 105$s$2 of the substrate 105 may be referred to as an upper surface 105$s$1 and a lower surface 105$s$2 of the substrate 105, or may be referred to as a first surface 105$s$1 and a second surface 105$s$2 of the substrate 105.

The light emitting structure 110 may be disposed on the front surface 105$s$1 of the substrate 105. In an example, the front surface 105$s$1 of the substrate 105 may be formed with a concave-convex structure. The concave-convex structure may improve crystalline characteristics and light emission efficiency of semiconductor layers constituting the light emitting structure 110.

In the example embodiment, the concave-convex structure of the front surface 105$s$1 of the substrate 105 is illustrated as having a dome-shaped convex shape, but the shape thereof is not limited thereto. For example, the concave-convex structure of the front surface 105$s$1 of the substrate 105 may be formed to have various shapes, e.g., a quadrangular shape, a triangular shape, or the like. In addition, the concave-convex structure of the front surface 105$s$1 of the substrate 105 may be selectively formed or may be omitted.

In an example, the substrate 105 may be removed later, depending on an example embodiment. For example, the substrate 105 may be provided as a growth substrate for growth of the light emitting structure 110, and then, may be removed through a separation process. The substrate 105 may be separated from the light emitting structure 110 using, e.g., laser lift off (LLO), chemical lift off (CLO), or the like.

The light emitting structure 110 may include a first semiconductor layer 115, an active layer 120, and a second semiconductor layer 125.

The first semiconductor layer 115 may be grown from the front surface 105$s$1 of the substrate 105. The first semiconductor layer 115 may be configured of a semiconductor doped with an n-type impurity, and may be an n-type nitride semiconductor layer.

When viewed from above, as illustrated in FIG. 1, the first semiconductor layer 115 may have a quadrangular shape. The first semiconductor layer 115 may have a first corner C1, a second corner C2, a third corner C3, and a fourth corner C4 sequentially arranged in a counterclockwise direction when viewed from above. The first semiconductor layer 115 may have a first edge S1 between the first corner C1 and the second corner C2, a second edge S2 between the second corner C2 and the third corner C3, a third edge S3 between the third corner C3 and the fourth corner C4, and a fourth edge S4 between the fourth corner C4 and the first corner C1, when viewed from above. Thus, the first and third edges S1 and S3 may oppose each other, and the second and fourth edges S2 and S4 may oppose each other.

In an example, since the first semiconductor layer 115 may be self-aligned on the substrate 105 when viewed from above, e.g., grown from the substrate 105, the first to fourth corners C1 to C4 and the first to fourth edges S1 to S4 of the first semiconductor layer 115 may also be applied, e.g., correspond, to the substrate 105 in the same manner.

The first semiconductor layer 115 may include a recessed region E and a protruding region M, as illustrated in FIG. 2A. The recessed region E may be referred to as an etched region, and the protruding region M may be referred to as a mesa region. In the drawings, a reference character '13' may indicate a boundary B between the recessed region E and the protruding region M, e.g., the boundary B may extend along the first to fourth edges S1 to S4 of the first semiconductor layer 115 while being spaced apart therefrom (FIG. 1). In the first semiconductor layer 115, an upper surface of the protruding region M may be higher than an upper surface of the recessed region E, as illustrated in FIG. 2A.

In an example, the protruding region M may have a shape of which a width is gradually reduced from a bottom to a top, as illustrated in FIG. 2A. Thus, the protruding region M may have an inclined side, e.g., an upper portion of the protruding region M may have a trapezoidal cross-section.

In an example, a portion of an upper surface of the recessed region E may be defined as a first contact region CT1. In an example, at least a portion of an upper surface of the protruding region M may be defined as a second contact region CT2.

Throughout the specification, the terms 'first', 'second', and the like may be used to describe various elements, but the constituent elements are not limited by these terms. The terms are used only for distinguishing one component from another. For example, a 'first component' may be named a 'second component' without departing from the scope of the present disclosure.

In the case of the first semiconductor layer 115, the protruding region M may be spaced apart from the first to fourth edges S1 to S4. The recessed regions E may be disposed between the protruding region M and the first to fourth edges S1 to S4. For example, referring to FIG. 1, the recessed regions E may be between the boundary B and the corresponding first to fourth edges S1 to S4, while the protruding region M may be separated from the recessed regions E by the boundary B. For example, as further illustrated in FIG. 1, the recessed regions E may extend along the first to fourth edges S1 to S4, and a portion of the recessed region E may extend in a direction oriented from a portion of the first edge S1 to the third edge S3, e.g., in parallel to the fourth edge S4.

Referring back to FIG. 2A, the active layer 120 and the second semiconductor layer 125 may be sequentially stacked on an upper surface of the protruding region M of the first semiconductor layer 115. The second semiconductor layer 125 may be formed of a semiconductor doped with a p-type impurity and may be a p-type nitride semiconductor layer.

In an example, the first and second semiconductor layers 115 and 125 may be stacked with their positions changed according to an example embodiment. The first and second semiconductor layers 115 and 125 as above may be represented by an empirical formula, $Al_xIn_yGa_{(1-x-y)}N$ ($0 \leq x < 1$, $0 \leq y < 1$, $0 \leq x+y < 1$), e.g., a material such as GaN, AlGaN, InGaN, or AlInGaN may be used.

The active layer 120 may be interposed between the first and second semiconductor layers 115 and 125. The active layer 120 may emit light having a predetermined amount of energy by the recombination of electrons and holes when the semiconductor light emitting device operates. The active layer 120 may include a material having an energy band gap lower than an energy band gap of a material of the first and second semiconductor layers 115 and 125. For example, when the first and second semiconductor layers 115 and 125 are GaN-based compound semiconductors, the active layer 120 may include an InGaN-based compound semiconductor having an energy band gap lower than an energy band gap of GaN. In addition, the active layer 120 may have a multiple quantum well (MQW) structure in which a quantum well layer and a quantum barrier layer are alternately stacked, e.g., an InGaN/GaN structure, but a structure of the active layer 120 is not limited thereto. For example, the active layer 120 may have a single quantum well (SQW) structure.

The passivation layer 130 may be disposed on the light emitting structure 110. The passivation layer 130 may cover a portion of the first semiconductor layer 115 and a portion of the second semiconductor layer 125. The passivation layer 130 may include a first opening 130a exposing the first contact region CT1 of the recessed region E of the first semiconductor layer 115, and a second opening 130b exposing the second contact region CT2 of the second semiconductor layer 125.

The contact structure 135 may be disposed on an upper surface of the second semiconductor layer 125. The contact structure 135 may be electrically connected to the second semiconductor layer 125 while being in contact with the second contact region CT2 of the second semiconductor layer 125.

In an example, the contact structure 135 may include a metal layer 140 and a cover layer 145. The cover layer 145 may cover an upper surface and a side of the metal layer 140 to protect the metal layer 140. The metal layer 140 may be a reflective metal layer. The cover layer 145 may be formed of a conductive material, but a material of the cover layer 145 is not limited thereto. For example, the cover layer 145 may be formed of an insulating material, or may be omitted.

The lower insulating pattern 150 may be disposed on the contact structure 135 and the passivation layer 130. The lower insulating pattern 150 may include a first opening 150a exposing the first contact region CT1 of the first semiconductor layer 115, and a second opening 150b exposing a third contact region CT3 of the contact structure 135.

The first conductive pattern 155n, the second conductive pattern 155p, and the floating conductive pattern 155f may be disposed on the lower insulating pattern 150, may be formed of the same material, and may be spaced apart from each other. For example, the first conductive pattern 155n, the second conductive pattern 155p, and the floating conductive pattern 155f may be formed of a material including at least one of gold (Au), tungsten (W), platinum (Pt), silicon (Si), iridium (Ir), silver (Ag), copper (Cu), nickel (Ni), and alloys thereof.

The first conductive pattern 155n may be disposed on the lower insulating pattern 150 and may extend on the first contact region CT1 of the first semiconductor layer 115 to be electrically connected to the first semiconductor layer 115. The first conductive pattern 155n may contact the first contact region CT1 of the first semiconductor layer 115.

For example, as illustrated in FIG. 2C, in order to improve characteristics of contact resistance between the first conductive pattern 155n and the first contact region CT1 of the first semiconductor layer 115, a conductive buffer pattern 153 may be disposed between the first conductive pattern 155n and the first contact regions CT1 of the first semiconductor layer 115. In another example, as illustrated in FIG. 2A, the conductive buffer pattern 153 of FIG. 2C may be omitted, so the first conductive pattern 155n may be in direct contact with the contact region CT1 of the first semiconductor layer 115.

As further illustrated in FIG. 2A, the second conductive pattern 155p may be disposed on the lower insulating pattern 150 and may extend to an upper portion of the third contact region CT3 of the contact structure 135 to be electrically connected to the contact structure 135. Thus, the second conductive pattern 155p may be electrically connected to the second semiconductor layer 125 through the contact structure 135. When viewed from above, as illustrated in FIG. 1, the first conductive pattern 155n may be adjacent to the first edge S1, the second edge S2, and the fourth edge S4, and the second conductive pattern 155p may be adjacent to the third edge S3.

The floating conductive pattern 155f may be disposed on the lower insulating pattern 150 and may be electrically isolated. The floating conductive pattern 155f may be closer to the first conductive pattern 155n than to the second conductive pattern 155p, and may be disposed to be adjacent to the first conductive pattern 155n.

The floating conductive pattern 155f may include portions adjacent to at least two of the first to fourth corners C1 to C4. When viewed from above, as illustrated in FIG. 1, the floating conductive pattern 155f may include a first portion 155f_1 disposed between the first corner C1 and the first conductive pattern 155n, and a second portion 155f_2 disposed between the second corner C2 and the first conductive pattern 155n. The first portion 155f_1 of the floating conductive pattern 155f may be adjacent to the first corner C1, and the second portion 155f_2 thereof may be adjacent to the second corner C2. The floating conductive pattern 155f may not overlap end portions of the first semiconductor layer 115, such as the first to fourth corners C1 to C4 and the first to fourth edges S1 to S4. The floating conductive pattern 155f may not be aligned with end portions of the first semiconductor layer 115, such as the first to fourth corners C1 to C4 and the first to fourth edges S1 to S4 in a vertical direction.

Referring to FIG. 2B, the floating conductive pattern 155f may include a lower portion 155a, overlapping the recessed region E of the first semiconductor layer 115, an upper portion 155b, overlapping an upper surface of the protruding region M of the first semiconductor layer 115, and an intermediate portion 155c, overlapping an inclined side of the protruding region M. For example, the intermediate portion 155c may be an inclined portion extending along and overlapping the inclined side of the protruding region M. The floating conductive pattern 155f described above may be formed of metal to serve as a reflective metal capable of increasing light efficiency. A portion of the upper portion 155b of the floating conductive pattern 155f may overlap a portion of the contact structure 135. The floating conductive pattern 155f and the first conductive pattern 155n may be adjacent to each other, and may be spaced apart on the contact structure 135. Thus, the floating conductive pattern 155f may be disposed to have a form in which the floating conductive pattern 155f covers end portions of the contact structure 135 adjacent to the first and second corners C1 and C2. For example, as illustrated in FIG. 2B, the floating conductive pattern 155f may be conformal on an edge portion of the contact structure 135, e.g., to continuously overlap a lateral (e.g., side) surface and a portion of an upper surface of the contact structure 135 adjacent to the first and second corners C1 and C2. Therefore, the floating conductive pattern 155f may prevent a defect caused by cracks occurring from the end portions of the contact structure 135.

On the same plane, the first conductive pattern 155n, the second conductive pattern 155p, and the floating conductive pattern 155f may have the same thickness, e.g., measured along a direction normal to an upper surface of the substrate 105. For example, the first conductive pattern 155n, the second conductive pattern 155p, and the floating conductive pattern 155f may have the same thickness T on a flat upper surface of the lower insulating pattern 150 (FIG. 2B).

The upper insulating pattern 160 may be disposed, e.g., directly, on the first conductive pattern 155n, the second conductive pattern 155p, and the floating conductive pattern 155f, and may have a first opening 160a exposing a fourth contact region CT4 of the first conductive pattern 155n and a second opening 160b exposing a fifth contact region CT5 of the second conductive pattern 155p. As illustrated in FIG. 2B, the entirety of the floating conductive pattern 155f may be enclosed and electrically insulated by the lower and upper insulating patterns 150 and 160.

The first electrode 165n may be disposed on the fourth contact region CT4 of the first conductive pattern 155n, and the second electrode 165p may be disposed on the fifth contact region CT5 of the second conductive pattern 155p. The first connection structure 170n may be disposed on the first electrode 165n, and the second connection structure 170p may be disposed on the second electrode 165p. The first and second connection structures 170n and 170p may be solder ball structures that may be formed of a conductive material, e.g., solder or the like.

In an example, as the floating conductive pattern 155f is separated from the first conductive pattern 155n, a buffer portion 161 may be formed. The buffer portion 161 may be formed such that stress occurring during forming the first connection structure 170n or occurring by the first connection structure 170n, transferred to an end of the contact structure 135 via the first conductive pattern 155n, may be reduced. The buffer portion 161 may prevent cracks from occurring at an end of the contact structure 135, thereby preventing occurrence of defects.

The floating conductive pattern 155f may include the first portion 155f_1 adjacent to the first corner C1, and the second portion 155f_2 adjacent to the second corner C2, but an example embodiment of the present disclosure is not limited thereto. Thus, the floating conductive pattern 155f may have various shapes. Various examples in which a shape of the floating conductive pattern 155f may be modified to have various shapes will be described with reference to FIGS. 3 to 7.

Figure 3:
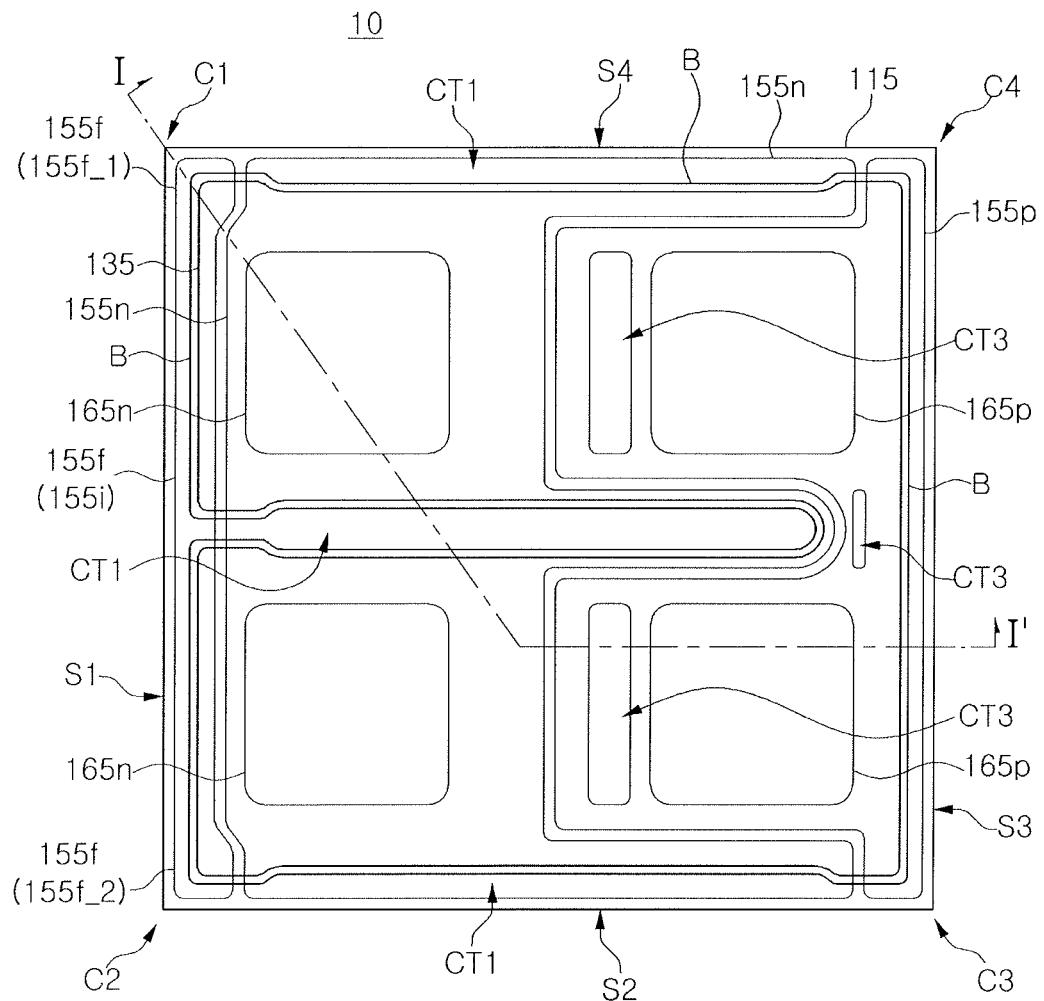
FIG. 3 illustrates a plan view of another modified example of a semiconductor light emitting device according to an embodiment.
Figure 4:
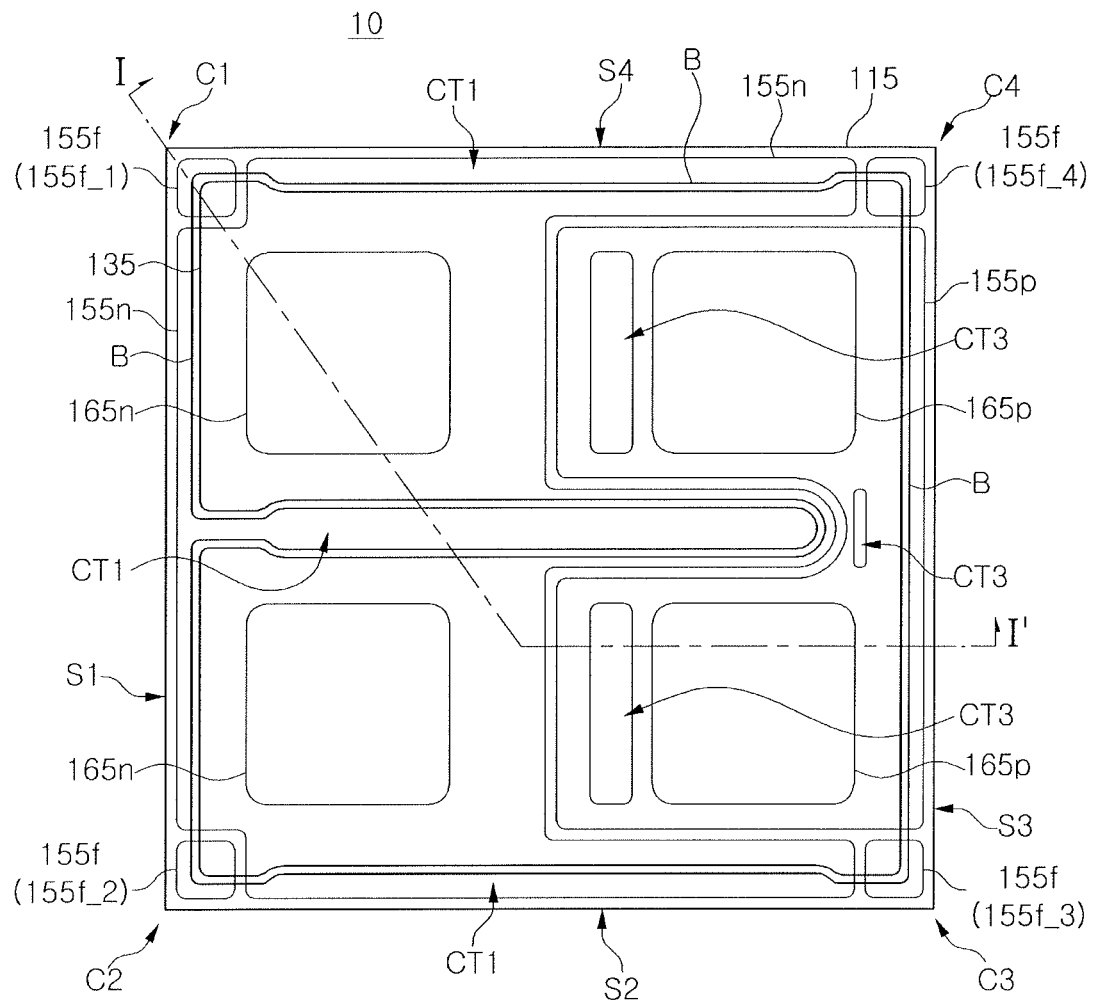
FIG. 4 illustrates a plan view of another modified example of a semiconductor light emitting device according to an embodiment.
Figure 5:
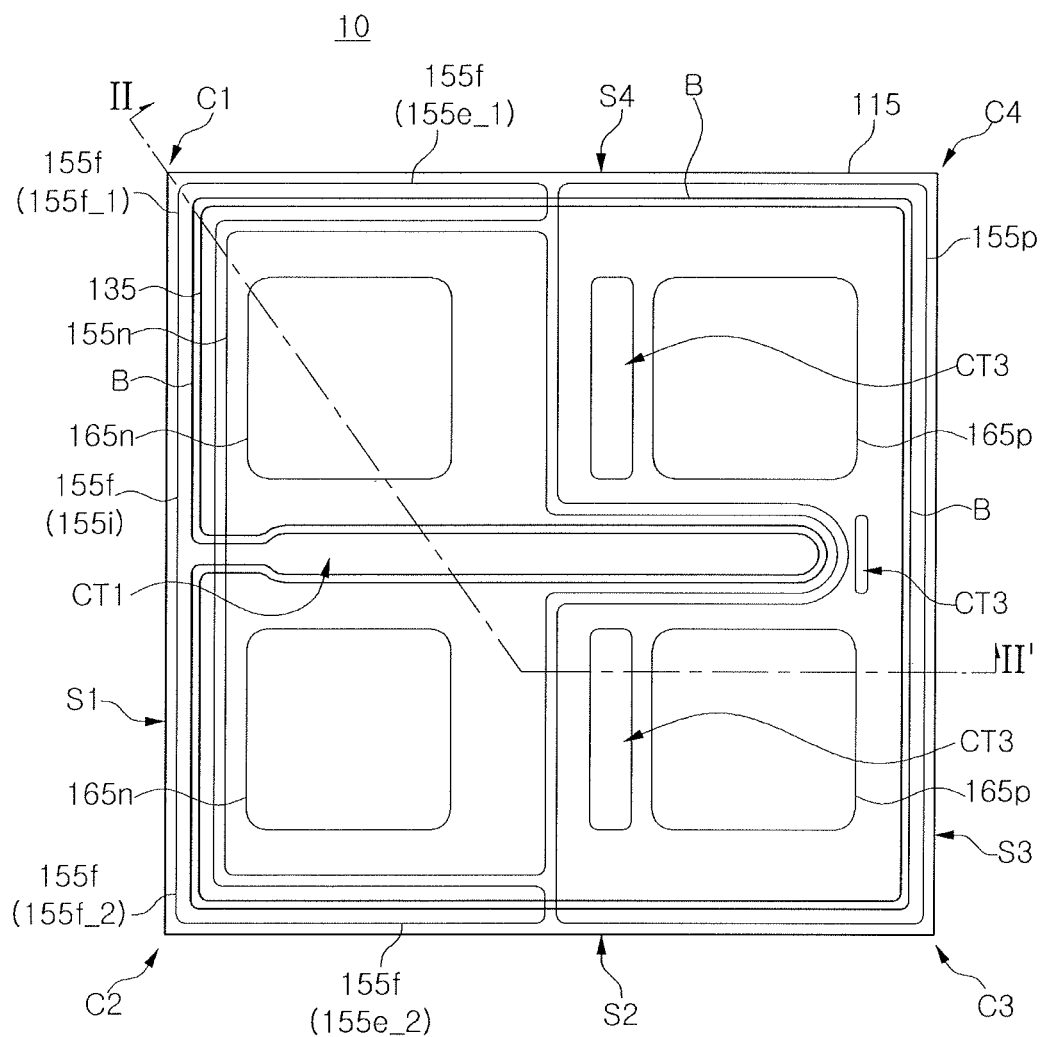
FIG. 5 illustrates a schematic plan view of a semiconductor light emitting device according to an embodiment.
Figure 6A:
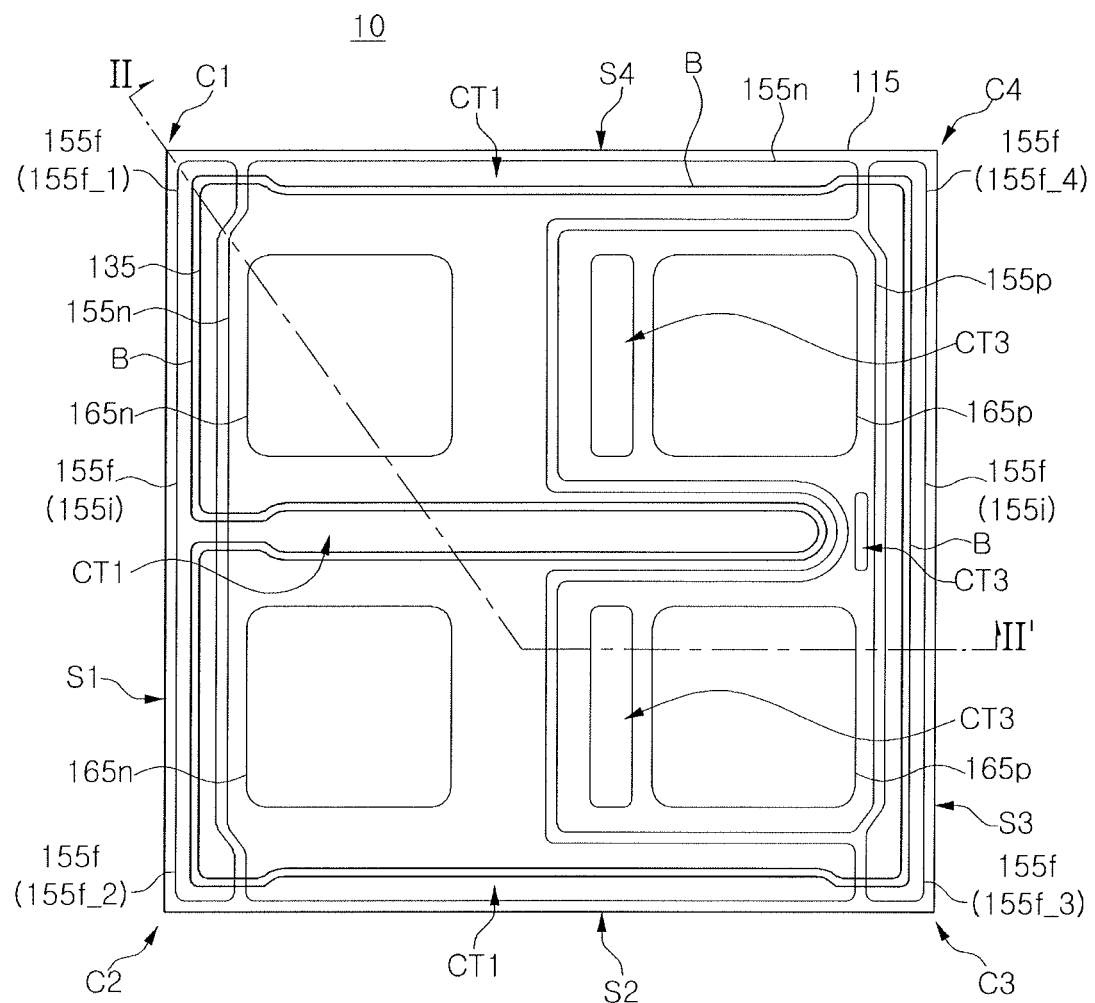
FIG. 6A illustrates a plan view of a modified example of a semiconductor light emitting device according to an embodiment.
Figure 6B:
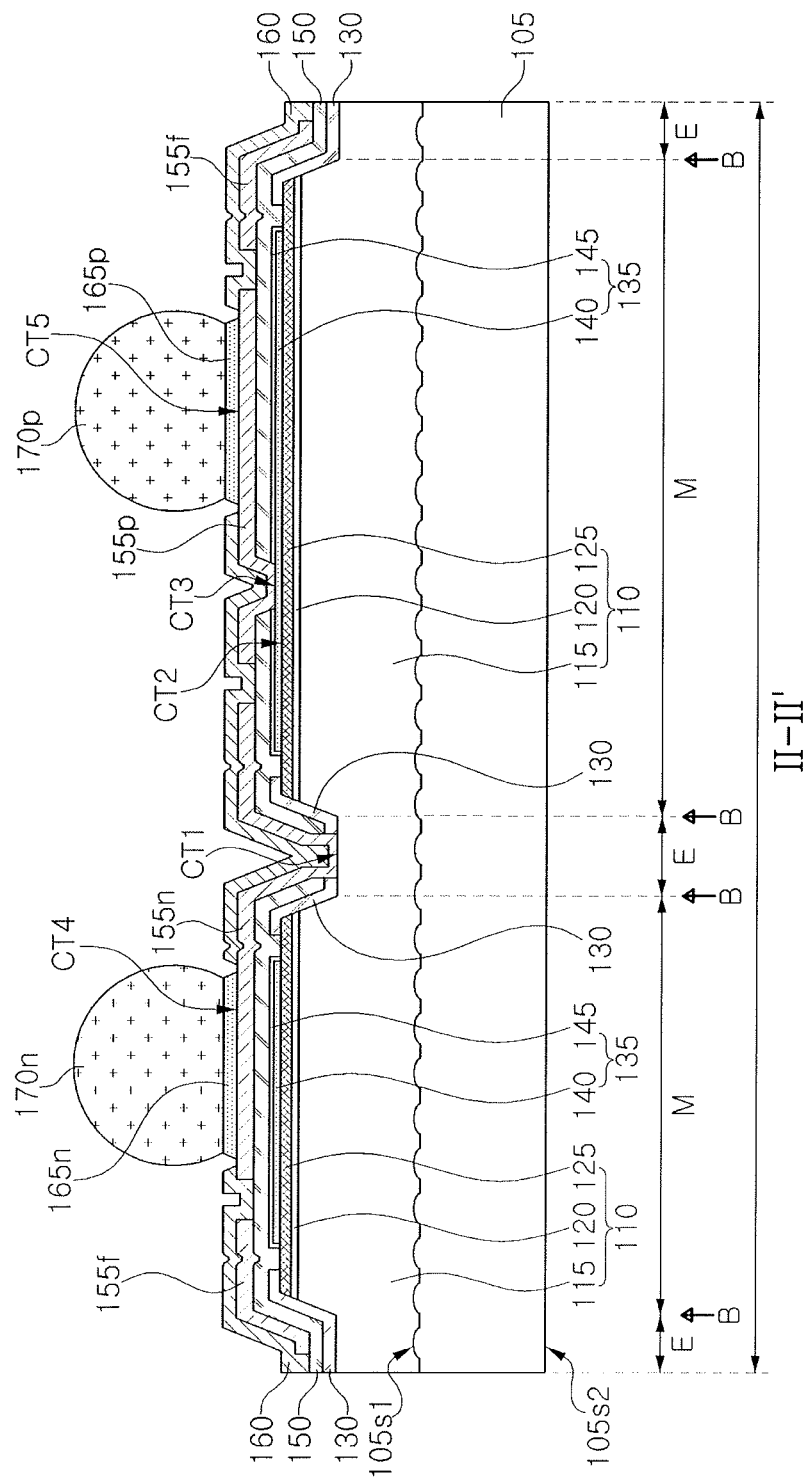
FIG. 6B illustrates a cross-sectional view along line II-II' of FIG. 6A.
Figure 7:
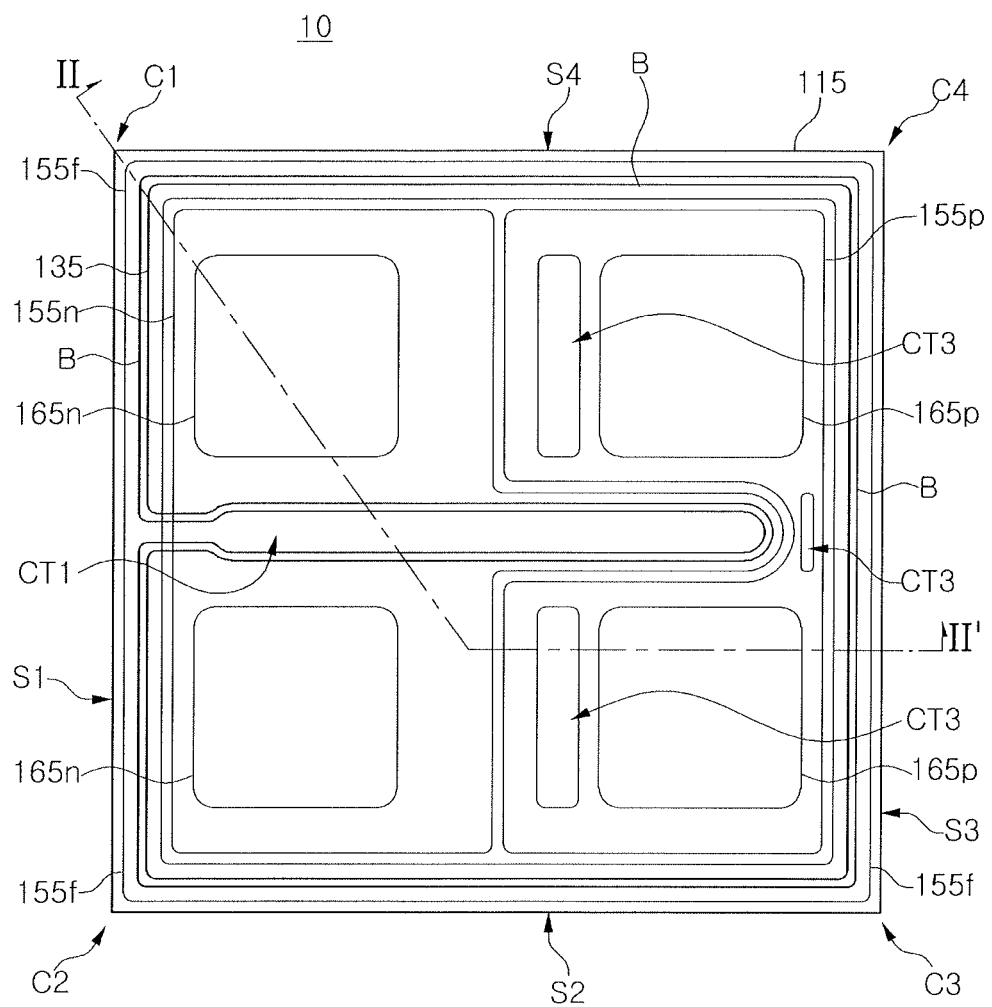
FIG. 7 illustrates a plan view of another modified example of a semiconductor light emitting device according to an embodiment.

FIG. 3 is a plan view schematically illustrating another modified example of the semiconductor light emitting device according to an embodiment. FIG. 4 is a plan view schematically illustrating another modified example of the semiconductor light emitting device according to an embodiment. FIG. 5 is a schematic plan view illustrating another modified example of the semiconductor light emitting device according to an embodiment. Further, FIG. 6A is a plan view schematically illustrating a modified example of the semiconductor light emitting device according to an embodiment, and FIG. 6B is a cross-sectional view schematically illustrating a region along line II-II' of FIG. 6A. Line II-II' of FIG. 6A may correspond to line I-I' of FIG. 1. FIG. 7 is a plan view schematically illustrating another modified example of the semiconductor light emitting device according to an embodiment.

In FIGS. 3 to 5, cross-sectional shapes of portions indicated by lines I-I' may be the same as the cross section of FIG. 2A. Thus, the sectional shapes of the portions indicated by lines I-I' in FIGS. 3 to 5 may be understood with reference to FIG. 2A. In addition, a cross-sectional shape of a portion indicated by line II-II' in FIG. 7 may be the same as that of FIG. 6B. Thus, the cross-sectional shape of the portion indicated by line II-II' in FIG. 7 may be understood with reference to FIG. 6B. Since the cross-sectional shapes of the portions indicated by lines I-I' in FIGS. 3 to 5 may be the same as those in FIG. 2A, FIGS. 3 to 5 will be described together with FIG. 2A. Since the cross-sectional shape of the portion indicated by line II-II' in FIG. 7 may be the same as that in FIG. 6B, FIG. 7 will be described with reference to FIG. 6B.

For example, referring to FIGS. 2A and 3, the floating conductive pattern 155f may include the first portion 155f_1 disposed between the first corner C1 and the first conductive pattern 155n, the second portion 155f_2 disposed between the second corner C2 and the first conductive pattern 155n, and a connecting portion 155i disposed between the first edge S1 and the first conductive pattern 155n to connect the first and second portions 155f_1 and 155f_2 to each other. The first portion 155f_1 of the floating conductive pattern 155f may be adjacent to the first corner C1, the second portion 155f_2 thereof may be adjacent to the second corner C2, and the connecting portion 155i may be adjacent to the first edge S1.

In another example, with reference to FIGS. 2A and 4, the floating conductive pattern 155f may include first to fourth portions 155f_1, 155f_2, 155f_3 and 155f_4 spaced apart from one another. The first portion 155f_1 of the floating conductive pattern 155f may be adjacent to the first corner C1, the second portion 155f_2 thereof may be adjacent to the second corner C2, the third portion 155f_3 may be adjacent to the third corner C3, and the fourth portion 155f_4 may be adjacent to the fourth corner C4.

In yet another example, with reference to FIGS. 2A and 5, the floating conductive pattern 155f may include the first portion 155f_1 disposed between the first corner C1 and the first conductive pattern 155n, the second portion 155f_2 disposed between the second corner C2 and the first conductive pattern 155n, the connecting portion 155i disposed between the first edge S1 and the first conductive pattern 155n to connect the first and second portions 155f_1 and 155f_2 to each other, a first extending portion 155e_1 extended from the first portion 155f_1 to a space between the fourth edge S4 and the first conductive pattern 155n, and a second extending portion 155e_2 extended from the second portion 155f_2 to a space between the second edge S2 and the first conductive pattern 155n. The first portion 155f_1 of the floating conductive pattern 155f may be adjacent to the first corner C1, the second portion 155f_2 thereof may be adjacent to the second corner C2, the first extending portion 155e_1 may extend in a direction from the first portion 155f_1 to the fourth corner C4, and the second extending portion 155e_2 may extend in a direction from the second portion 155f_2 to the third corner C3.

In yet another example, with reference to FIGS. 6A and 6B, the floating conductive pattern 155f may include portions disposed between the first conductive pattern 155n and the first edge S1, and between the second conductive pattern 155p and the third edge S3. For example, the floating conductive pattern 155f may include the first portion 155f_1 disposed between the first corner C1 and the first conductive pattern 155n, the second portion 155f_2 disposed between the second corner C2 and the first conductive pattern 155n, the connecting portion 155i disposed between the first edge S1 and the first conductive pattern 155n while connecting the first and second portions 155f_1 and 155f_2 to each other, the third portion 155f_3 adjacent to the third corner C3, the fourth portion 155f_4 adjacent to the fourth corner C4, and the connecting portion 155i disposed between the third edge S3 and the second conductive pattern 155p while connecting the third and fourth portions 155f_3 and 155f_4 to each other.

In yet another example, referring to FIGS. 6B and 7, the floating conductive pattern 155f may have a quadrangular loop shape, arranged along the first to fourth edges S1 to S4. The floating conductive pattern 155f may surround the first and second conductive patterns 155n and 155p.

As described above, the floating conductive pattern 155f may include first and second portions 155f_1 and 155f_2 adjacent to at least two corners C1 and C2 among the first to fourth corners C1 to C4.

Hereinafter, with reference to FIGS. 8A, 8B, 9A, 9B, 10A, 10B, 11A, 11B, 12A, and 12B, an example of a method of forming a semiconductor light emitting device 10 according to an embodiment will be described. In the case of FIGS. 8A to 12B, FIGS. 8A, 9A, 10A, 11A and 12A are schematic plan views illustrating a method of forming the semiconductor light emitting device 10 according to an embodiment, and FIGS. 8B, 9B, 10B, 11B and 12B are cross-sectional views schematically illustrating regions taken along lines I-I' of FIGS. 8A, 9A, 10A, 11A and 12A.

Figure 8A:
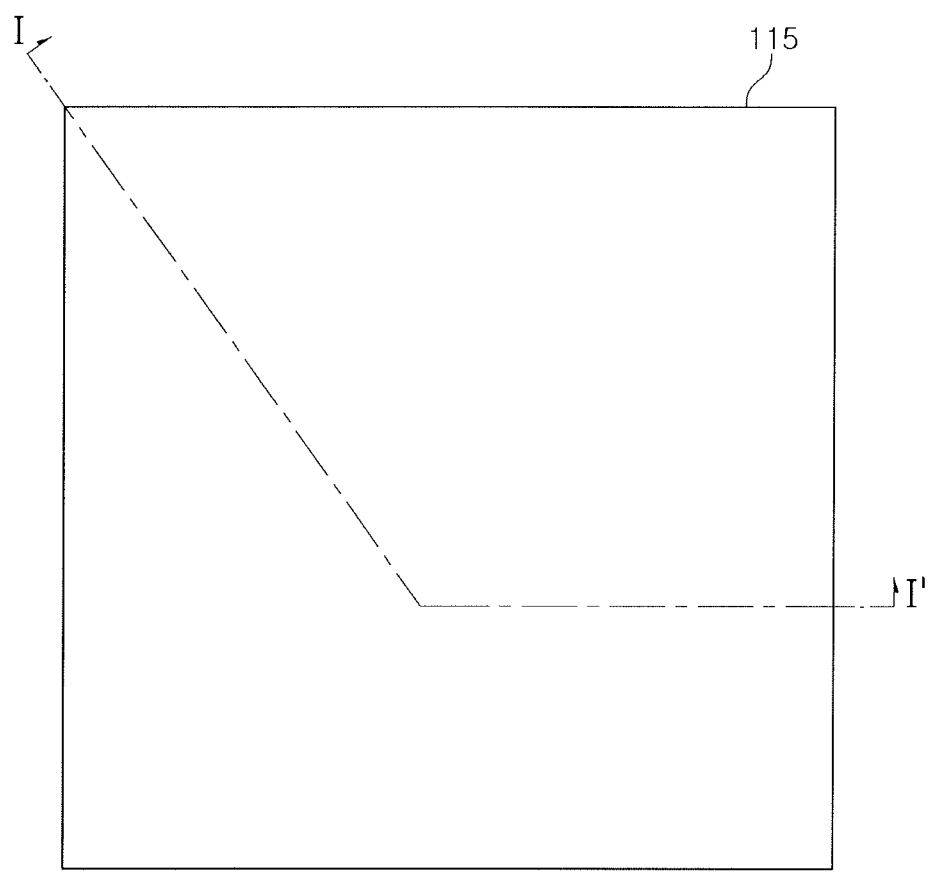
FIGS. 8A, 9A, 10A, 11A, and 12A illustrate plan views of stages in a method of forming a semiconductor light emitting device according to an embodiment.
Figure 8B:
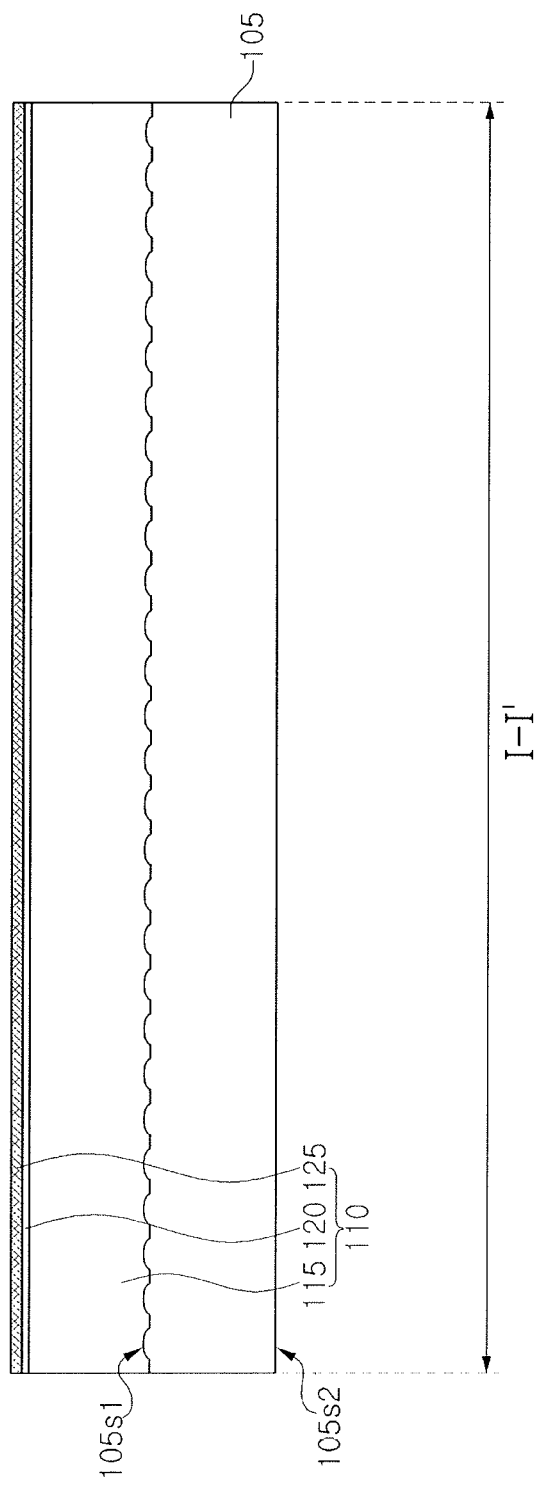
FIGS. 8B, 9B, 10B, 11B, and 12B illustrate cross-sectional views of stages in a method of forming a semiconductor light emitting device according to an embodiment.

With reference to FIGS. 8A and 8B, the light emitting structure 110 may be formed on the substrate 105. The substrate 105 may be formed of a material, such as silicon (Si), silicon carbide (SiC), $MgAl_2O_4$, MgO, $LiAlO_2$, $LiGaO_2$, gallium nitride (GaN), or the like. The substrate 105 may have the front surface 105s1 and a rear surface 105s2 opposing the front surface 105s1.

In an example, a concave-convex structure may be formed on the front surface 105s1 of the substrate 105. According to an example embodiment, a process of forming the concave-convex structure on the front surface 105s1 of the substrate 105 may be omitted.

The light emitting structure 110 may be formed on the front surface 105s1 of the substrate 105. The light emitting structure 110 may be formed of a plurality of layers, using a process such as metal organic chemical vapor deposition (MOCVD), hydride vapor phase epitaxy (HVPE), molecular beam epitaxy (MBE), or the like. For example, the light emitting structure 110 may include the first semiconductor layer 115, the active layer 120, and the second semiconductor layer 125 sequentially formed on the front surface 105s1 of the substrate 105. The first semiconductor layer 115 and the second semiconductor layer 125 may have different conductivity types. For example, the first semiconductor layer 115 may have n-type conductivity, and the second semiconductor layer 125 may have p-type conductivity.

Figure 9A:
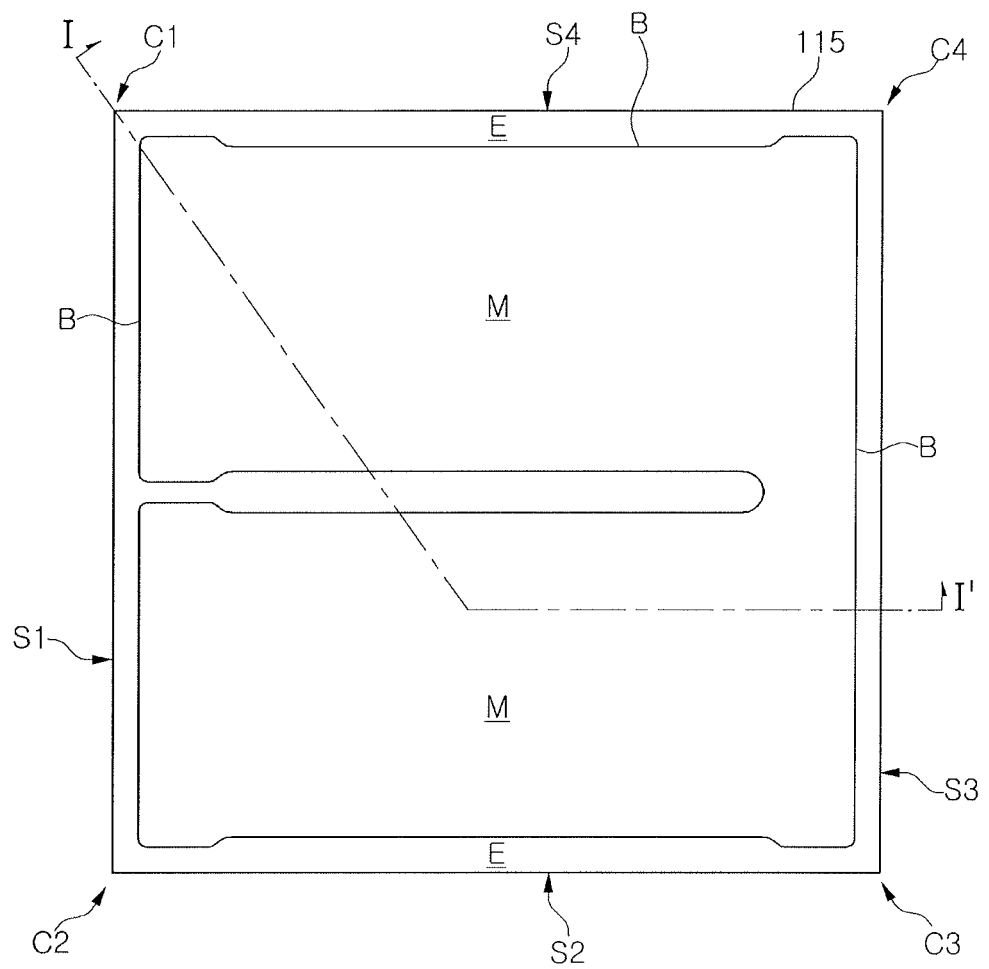
Figure 9B:
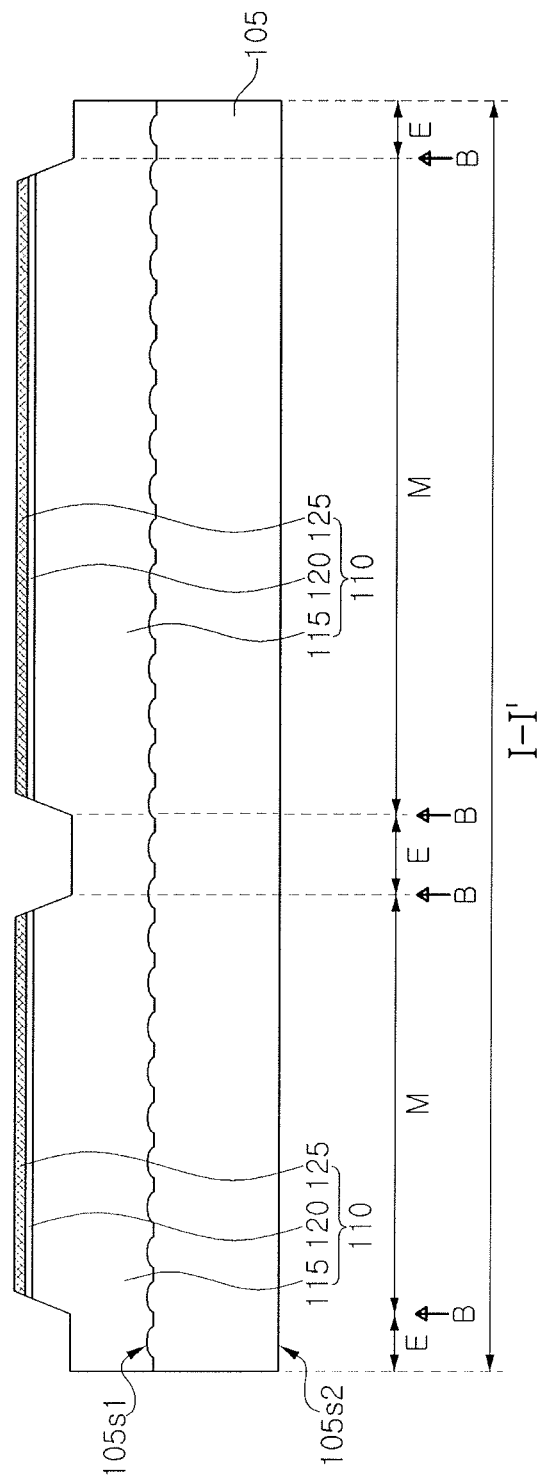

Referring to FIGS. 9A and 9B, portions of the second semiconductor layer 125, the active layer 120, and the first semiconductor layer 115 may be etched using a photolithography and etch processes. Thus, the first semiconductor layer 115 may have the recessed region E recessed by etching. A non-etched region of the first semiconductor layer 115 may be defined as the protruding region M. Thus, the protruding region M may have a shape relatively protruding as compared with the recessed region E. The protruding region M may have a mesa shape and may be referred to as a mesa region. The recessed region E may also be referred to as an etched region. The active layer 120 and the second semiconductor layer 125 may remain on an upper surface of the protruding region M.

When viewed from above, the first semiconductor layer 115 may have a quadrangular shape. The first semiconductor layer 115 may include the first corner C1, the second corner C2, the third corner C3, and the fourth corner C4 sequentially arranged in a counterclockwise direction when viewed from above. The first semiconductor layer 115 may have the first edge S1 between the first corner C1 and the second corner C2, the second edge S1 between the second corner C2 and the third corner C3, the third edge S3 between the third corner C3 and the fourth corner C4, and the fourth edge S4 between the fourth corner C4 and the first corner C1, when viewed from above. Thus, the first and third edges S1 and S3 may oppose each other, and the second and fourth edges S2 and S4 may oppose each other.

Figure 10A:
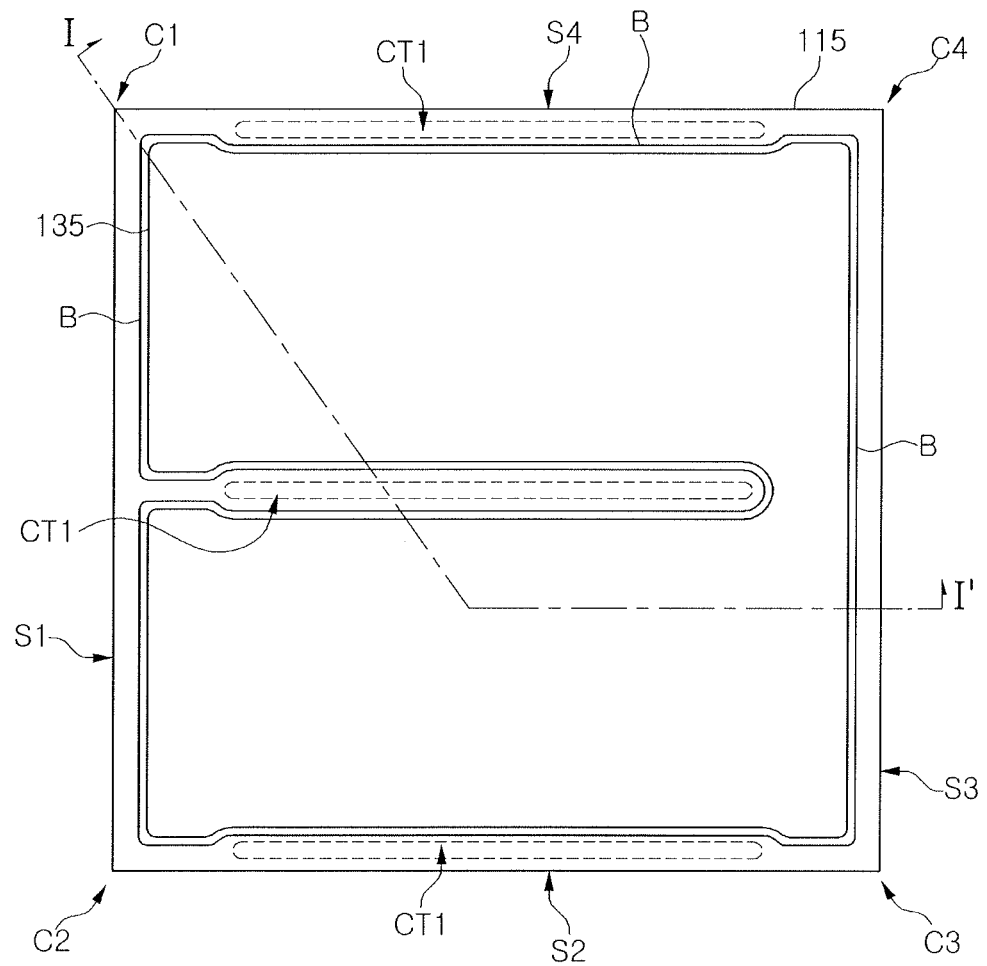
Figure 10B:
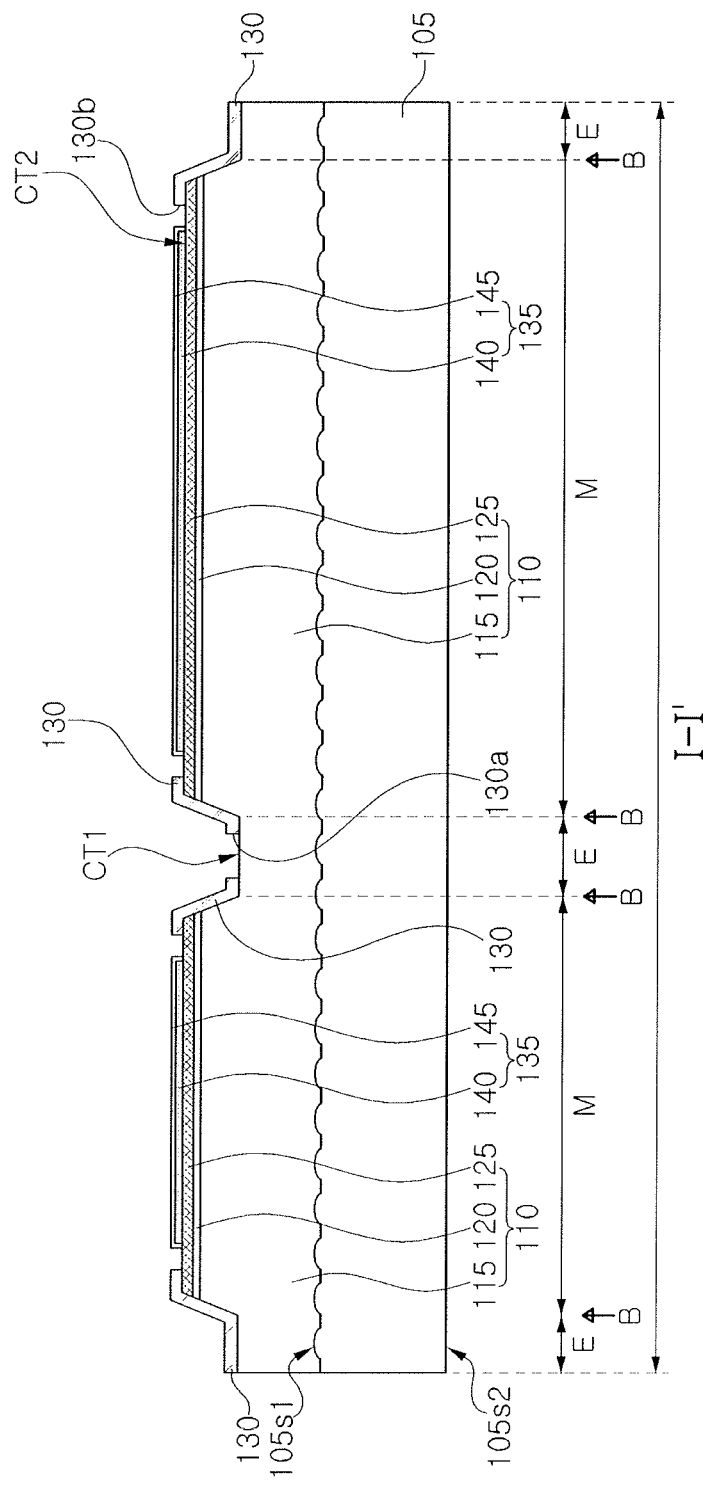

Referring to FIGS. 10A and 10B, the passivation layer 130 having the first opening 130a and the second opening 130b may be formed in an upper portion of or on the light emitting structure 110. The passivation layer 130 may be formed of an insulating material, e.g., silicon oxide, silicon nitride, or the like. The first opening 130a of the passivation layer 130 may allow a portion of the recessed region E of the first semiconductor layer 115 to be exposed (dashed circles in FIG. 10A), and the second opening 130b of the passivation layer 130 may allow a portion of the second semiconductor layer 125 to be exposed. The surface of the recessed region E of the first semiconductor layer 115 exposed by the first opening 130a of the passivation layer 130 may be referred to as the first contact region CT1, and the surface of the second semiconductor layer 125 exposed by the second opening 130b of the passivation layer 130 may be referred to as the second contact region CT2.

A contact structure 135 may be foil led on the second contact region CT2 of the second semiconductor layer 125. The contact structure 135 may include the metal layer 140 and the cover layer 145. The cover layer 145 may protect the metal layer 140 while covering an upper surface and a side of the metal layer 140.

Figure 11A:
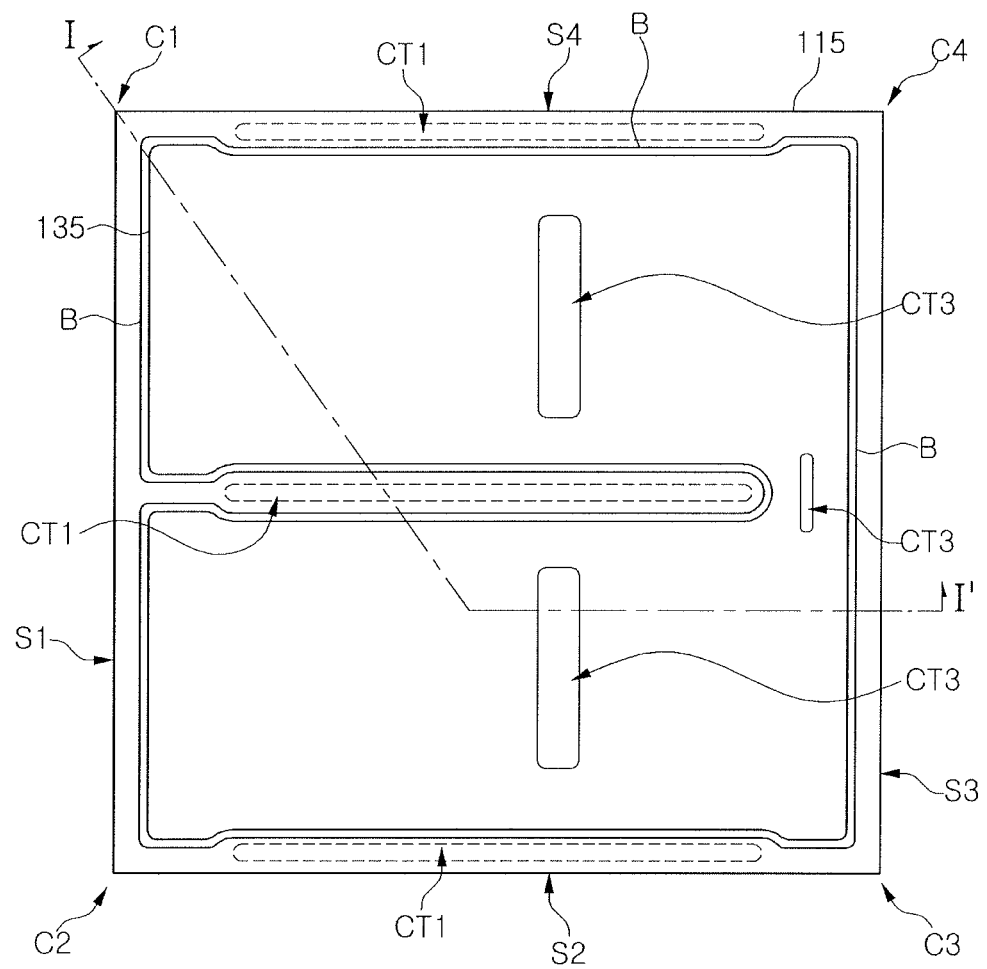
Figure 11B:
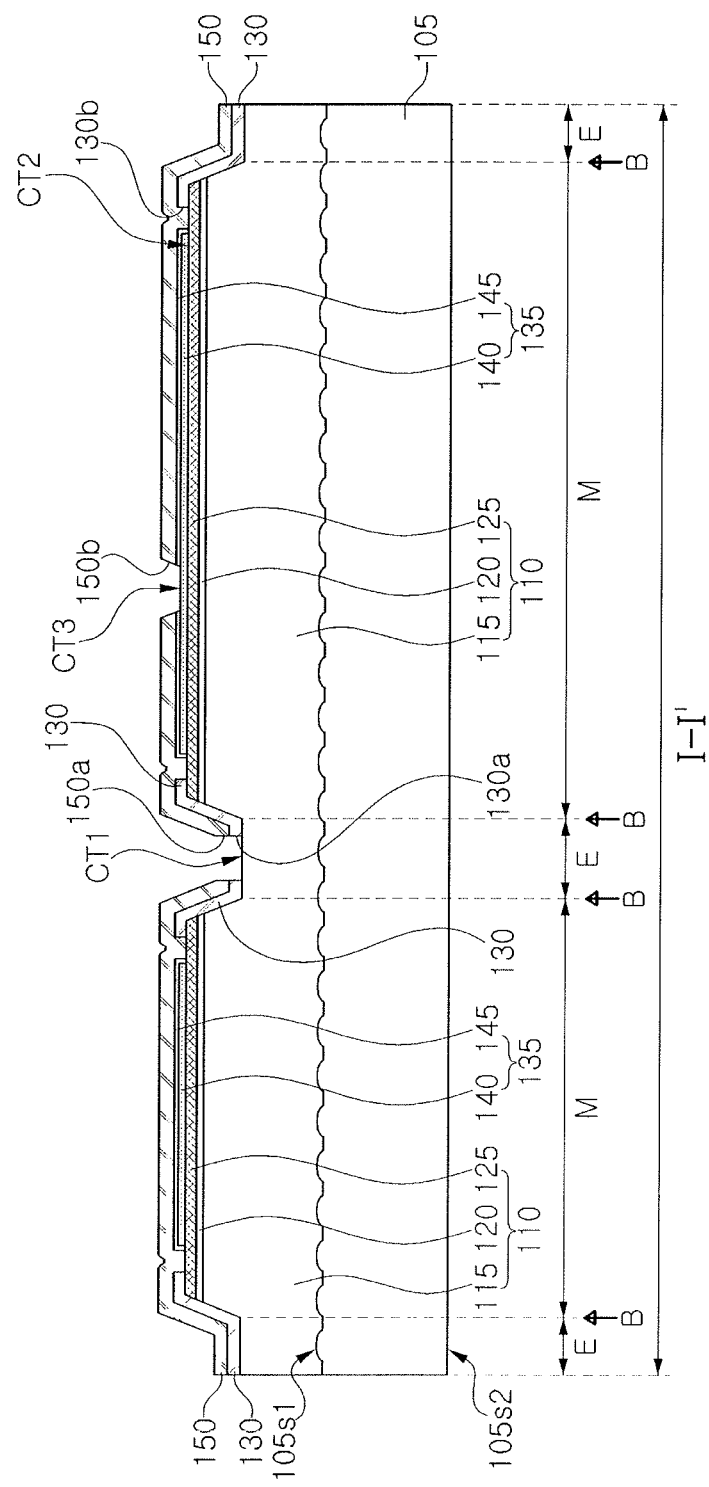

Referring to FIGS. 11A and 11B, the lower insulating pattern 150 having the first opening 150a and the second opening 150b may be formed on the substrate 105 having the passivation layer 130 and the contact structure 135.

The first opening 150a of the lower insulating pattern 150 may allow the first contact region CT1 of the recessed region E of the first semiconductor layer 115 to be exposed. The second opening 150b of the lower insulating pattern 150 may allow a portion of the contact structure 135 to be exposed. The portion of the contact structure 135 exposed by the second opening 150b of the lower insulating pattern 150 may be referred to as the third contact region CT3.

Figure 12A:
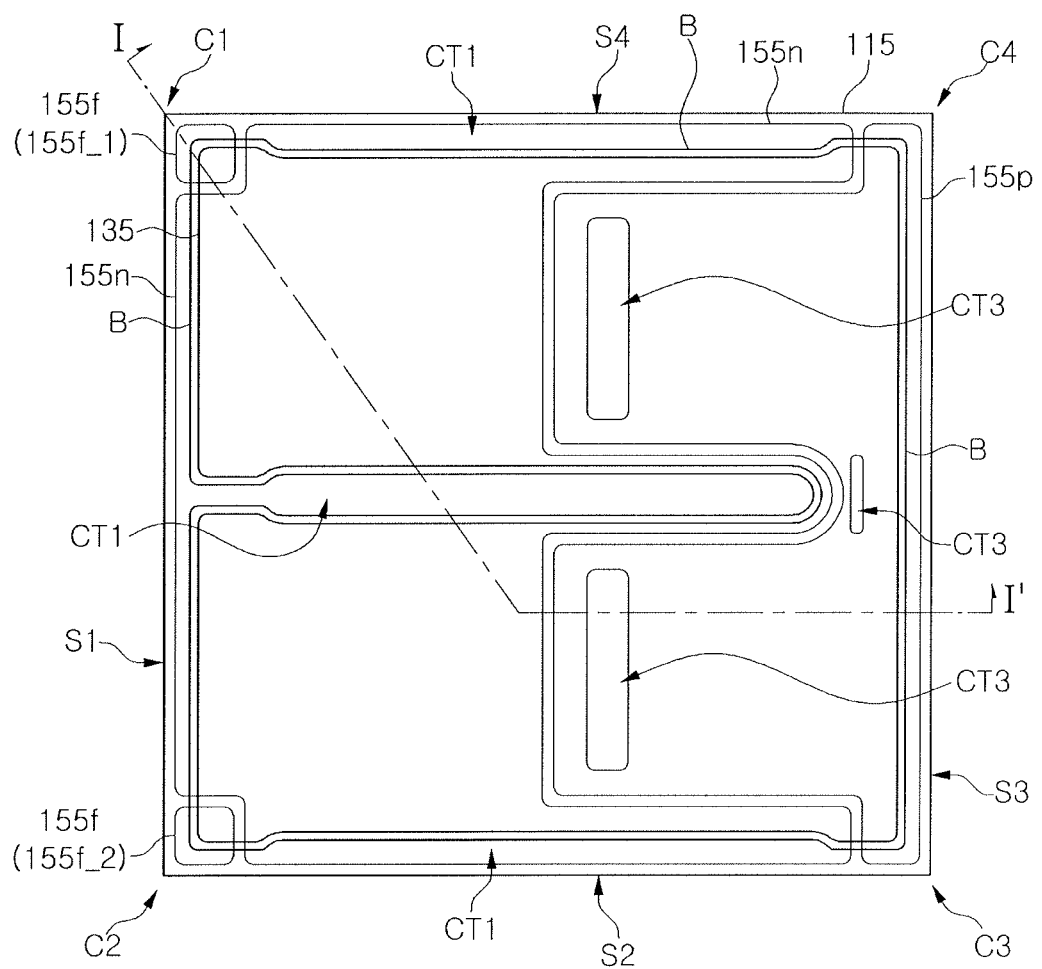
Figure 12B:
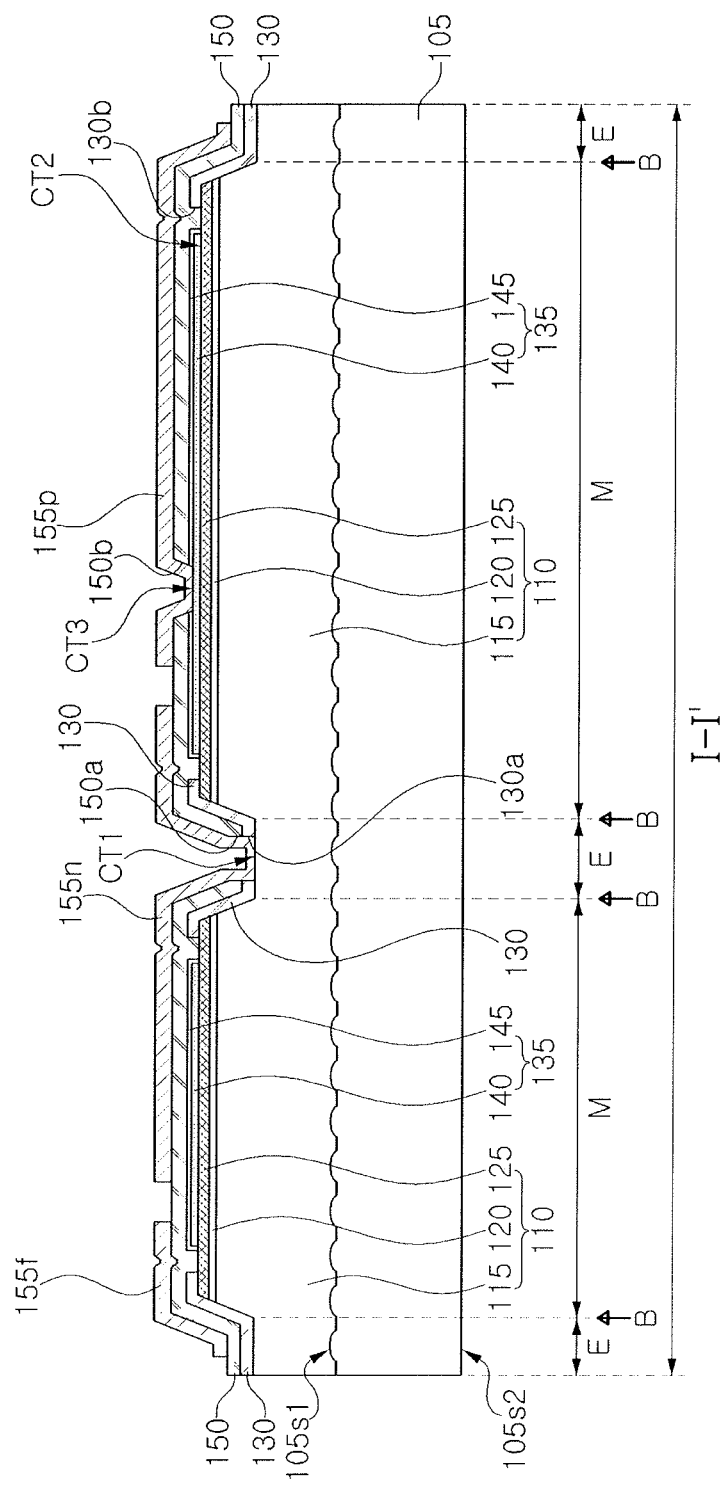

With reference to FIGS. 12A and 12B, the first conductive pattern 155n, the second conductive pattern 155p, and the floating conductive pattern 155f may be formed on the substrate 105 including the lower insulating pattern 150. Forming the first conductive pattern 155n, the second conductive pattern 155p, and the floating conductive pattern 155f may include forming a conductive material layer on the substrate 105 including the lower insulating pattern 150, and patterning the conductive material layer using a photolithography and etch processes. Thus, since the first conductive pattern 155n, the second conductive pattern 155p, and the floating conductive pattern 155f are formed using a single process, the first conductive pattern 155n, the second conductive pattern 155p, and the floating conductive pattern 155f may be formed of the same material. In addition, the first conductive pattern 155n, the second conductive pattern 155p, and the floating conductive pattern 155f may be formed to have the same thickness on a single plane.

In example embodiments, in the process of patterning the conductive material layer to form the first conductive pattern 155n, the second conductive pattern 155p, and the floating conductive pattern 155f, a planar shape of the floating conductive pattern 155f may be formed to have one shape among planar shapes of the floating conductive pattern 155f as described above with reference to FIGS. 1, 3, 4, 5A, 6 and 7, according to a pattern shape of the conductive material layer.

The first conductive pattern 155n may be electrically connected to the first contact region CT1 of the first semiconductor layer 115. The second conductive pattern 155p may be electrically connected to the third contact region CT3 of the contact structure 135. The floating conductive pattern 155f may be spaced apart from the light emitting structure 110 and electrically insulated therefrom.

In addition, referring to FIGS. 1, 2A and 2B, the upper insulating pattern 160 having the first opening 160a and the second opening 160b may be formed on the substrate including the first conductive pattern 155n, the second conductive pattern 155p, and the floating conductive pattern 155f. The first opening 160a of the upper insulating pattern 160 may allow a portion of the first conductive pattern 155n to be exposed, and the second opening 160b of the upper insulating pattern 160 may allow a portion of the second conductive pattern 155p to be exposed. The portion of the first conductive pattern 155n exposed by the first opening 160a of the upper insulating pattern 160 may be referred to as the fourth contact region CT4, and the portion of the second conductive pattern 155p exposed by the second opening 160b of the upper insulating pattern 160 may be referred to as the fifth contact region CT5.

First and second electrodes 165n and 165p may be formed on the substrate 105 including the upper insulating pattern 160. The first electrode 165n may be formed on the fourth contact region CT4 of the first conductive pattern 155n, and the second electrode 165p may be formed on the fifth contact region CT5 of the second conductive pattern 155p. The first and second electrodes 165n and 165p may be pads or under-bump metallurgy (UBM) layers. In an example, the number and arrangement of the first and second electrodes 165n and 165p may be variously modified.

First and second connection structures 170n and 170p may be formed on the substrate 105 including the first and second electrodes 165n and 165p. The first connection structure 170n may be formed on the first electrode 165n, and the second connection structure 170p may be formed on the second electrode 165p.

Figure 13:
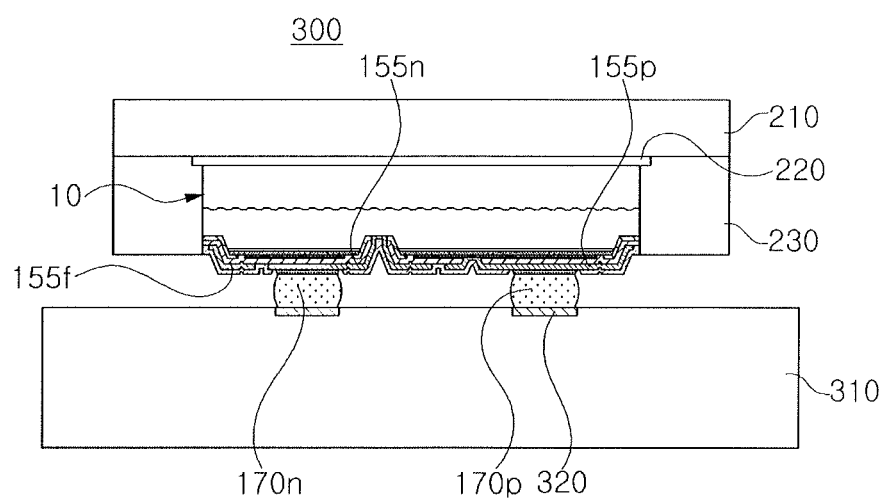
FIG. 13 illustrates a schematic cross-sectional view of an example in which a semiconductor light emitting device according to an embodiment is applied to a package.

The semiconductor light emitting device 10 as described above may be commercialized as a package. Hereinafter, an example in which the semiconductor light emitting device 10 as described above is applied to a package will be described with reference to FIG. 13. FIG. 13 is a schematic cross-sectional view illustrating an example in which a semiconductor light emitting device according to an example embodiment is applied to a package.

Referring to FIG. 13, one of the semiconductor light emitting devices 10 illustrated in FIGS. 1 to 7 may be mounted on a substrate 310 including pads 320. The first and second connection structures 170n and 170p of the semiconductor light emitting device 10 may be electrically connected to the pads 320 while being in contact with the pads 320. The semiconductor light emitting device 10 may be attached to a fluorescent layer 210 using an adhesive layer 220. A side pattern 230 may be disposed on a side of the semiconductor light emitting device 10. The side pattern 230 may be a reflective layer formed of a reflective material. The semiconductor light emitting device 10 attached to the fluorescent layer 210 may be mounted on the substrate 310. The substrate 310 may be a printed circuit board or a module substrate.

In the case of a semiconductor light emitting device according to example embodiments, an electrically-insulated floating conductive pattern 155f may be disposed at corners that may be vulnerable to cracking, thereby preventing defects due to cracks. Since the floating conductive pattern 155f is electrically insulated, even when metal, e.g., silver (Ag), constituting the contact structure 135, is diffused or migrated due to cracks in the lower insulating pattern 150 (and thus the contact structure 135 and the floating conductive pattern 155f are electrically short-circuited), a failure may not occur. The floating conductive pattern 155f as above may improve reliability of a semiconductor light emitting device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
    a first semiconductor layer including a recessed region and a protruding region, wherein, when viewed from above, the first semiconductor layer has a quadrangular shape, and includes:
        a first corner, a second corner, a third corner, and a fourth corner sequentially arranged in a counter-clockwise direction, and
        a first edge between the first corner and the second corner, a second edge between the second corner and the third corner, a third edge between the third corner and the fourth corner, and a fourth edge between the fourth corner and the first corner;
    an active layer and a second semiconductor layer sequentially stacked on the protruding region of the first semiconductor layer;
    a contact structure on the second semiconductor layer;
    a lower insulating pattern covering the first semiconductor layer and the contact structure, the lower insulating pattern having a first opening exposing a contact region of the first semiconductor layer and a second opening exposing a contact region of the contact structure;
    a first conductive pattern on the lower insulating pattern and extending into the first opening of the lower insulating pattern to be electrically connected to the contact region of the first semiconductor layer;
    a second conductive pattern on the lower insulating pattern and extending into the second opening of the lower insulating pattern to be electrically connected to the contact structure; and
    a floating conductive pattern on the lower insulating pattern and spaced apart from the first conductive pattern, the floating conductive pattern overlapping a facing corner of the contact structure that faces the first corner of the first semiconductor layer, the facing corner of the contact structure among all corners of the contact structure being closest to the first corner of the first semiconductor layer,
    wherein the first and second conductive patterns and the floating conductive pattern have a same thickness on a same plan,
    wherein, when viewed from above, a first portion of the floating conductive pattern has a first side surface facing the first edge and a second side surface facing the second edge, and
    wherein a conductive material is not disposed between the first side surface of the floating conductive pattern and the first edge facing the first side surface of the floating conductive pattern, and is not disposed between the second side surface of the floating conductive pattern and the fourth edge facing the second side surface of the floating conductive pattern.

2. The semiconductor light emitting device as claimed in claim 1, wherein, when viewed from above, the first portion of the floating conductive pattern is between the first corner and the first conductive pattern, and wherein, when viewed from above, the floating conductive pattern further includes a second portion between the second corner and the first conductive pattern.

3. The semiconductor light emitting device as claimed in claim 1, wherein, when viewed from above, the first portion of the floating conductive pattern is between the first corner and the first conductive pattern, a second portion between the second corner and the first conductive pattern, and wherein, when viewed from above, the floating conductive pattern further includes a connecting portion connecting the first portion and the second portion to each other.

4. The semiconductor light emitting device as claimed in claim 1, wherein, when viewed from above, the first portion of the floating conductive pattern is between the first corner and the first conductive pattern,
    wherein, when viewed from above, the floating conductive pattern further includes a second portion between the second corner and the first conductive pattern, a connecting portion connecting the first portion and the second portion to each other, a first extending portion extended from the first portion to a space between the fourth edge and the first conductive pattern, and a second extending portion extended from the second portion to a space between the second edge and the first conductive pattern.

5. The semiconductor light emitting device as claimed in claim 1, wherein, when viewed from above, the first portion of the floating conductive pattern is between the first conductive pattern and the first edge, and a second portion of the floating conductive pattern is between the second conductive pattern and the third edge.

6. The semiconductor light emitting device as claimed in claim 1, wherein, when viewed from above, the floating conductive pattern surrounds the first and second conductive patterns.

7. The semiconductor light emitting device as claimed in claim 1, wherein:
    the floating conductive pattern includes a lower portion overlapping the recessed region, an upper portion overlapping an upper surface of the protruding region, and an inclined portion overlapping a side of the protruding region while connecting the lower portion and the upper portion to each other, and
    an upper insulating pattern covers the floating conductive pattern, the upper and lower insulating patterns being in direct contact with each other on the recessed region at an edge of the lower portion of the floating conductive pattern.

8. The semiconductor light emitting device as claimed in claim 7, wherein the upper portion of the floating conductive pattern overlaps a portion of an upper surface of the contact structure.

9. The semiconductor light emitting device as claimed in claim 1, further comprising:
    an upper insulating pattern covering the first and second conductive patterns and the floating conductive pattern, and having a third opening exposing a portion of the first conductive pattern and a fourth opening exposing a portion of the second conductive pattern;

a first electrode on the first conductive pattern exposed by the third opening; and a second electrode on the second conductive pattern exposed by the fourth opening.

10. The semiconductor light emitting device as claimed in claim 1, further comprising a substrate having a front surface and a rear surface opposing the front surface, the first semiconductor layer being on the front surface of the substrate, and the front surface of the substrate having a concave-convex structure.

11. The semiconductor light emitting device as claimed in claim 1, wherein:

the floating conductive pattern includes the first portion and a second portion between the first and second corners and the first conductive pattern.

12. The semiconductor light emitting device as claimed in claim 11, wherein:

the protruding region is protruding upwardly to be higher than the recessed region, and the floating conductive pattern includes a lower portion overlapping the recessed region, an upper portion overlapping an upper surface of the protruding region, and an inclined portion connecting the lower portion and the upper portion to each other.

13. The semiconductor light emitting device as claimed in claim 11, wherein the floating conductive pattern and the first conductive pattern are adjacent to each other, and are spaced apart from each other on the contact structure.

14. The semiconductor light emitting device as claimed in claim 11, wherein:

the first conductive pattern is electrically connected to the first semiconductor layer while being in contact with the contact region of the first semiconductor layer, and the second conductive pattern is electrically connected to the second semiconductor layer via the contact structure.

15. A semiconductor light emitting device, comprising:

a first semiconductor layer including a recessed region and a protruding region, wherein, when viewed from above, the first semiconductor layer has a quadrangular shape, and includes:

a first corner, a second corner, a third corner, and a fourth corner sequentially arranged in a counter-clockwise direction, and a first edge between the first corner and the second corner, a second edge between the second corner and the third corner, a third edge between the third corner and the fourth corner, and a fourth edge between the fourth corner and the first corner;

an active layer and a second semiconductor layer sequentially stacked on the protruding region of the first semiconductor layer;

a contact structure on the second semiconductor layer;

a lower insulating pattern covering the first semiconductor layer and the contact structure, the lower insulating pattern having a first opening exposing a contact region of the first semiconductor layer and a second opening exposing a contact region of the contact structure;

a first conductive pattern on the lower insulating pattern and extending into the first opening of the lower insulating pattern to be electrically connected to the contact region of the first semiconductor layer;

a second conductive pattern on the lower insulating pattern and extending into the second opening of the lower insulating pattern to be electrically connected to the contact structure;

a floating conductive pattern on the lower insulating pattern and spaced apart from the first conductive pattern, the floating conductive pattern overlapping a facing corner of the contact structure that faces the first corner of the first semiconductor layer, the facing corner of the contact structure among all corners of the contact structure being closest to the first corner of the first semiconductor layer; and an upper insulating pattern covering the first and second conductive patterns and the floating conductive pattern, the floating conductive pattern being enclosed by the lower and upper insulating patterns, wherein, when viewed from above, the floating conductive pattern is between the first conductive pattern and the first corner of the first semiconductor layer, wherein, when viewed from above, a first width in a first direction of the floating conductive pattern is smaller than a second width in the first direction of the first conductive pattern, wherein, when viewed from above, a third width in a second direction of the floating conductive pattern is smaller than a fourth width in the second direction of the first conductive pattern, and wherein the first direction is parallel to the first and third edges, and wherein the second direction is parallel to the second and fourth edges.

16. The semiconductor light emitting device as claimed in claim 15, wherein the floating conductive pattern is directly between the lower and upper insulating patterns, the lower and upper insulating patterns being in contact with each other along edges of the floating conductive pattern.

17. The semiconductor light emitting device as claimed in claim 15, wherein the floating conductive pattern is conformal along an edge of the protruding region of the first semiconductor layer.

18. The semiconductor light emitting device as claimed in claim 15, wherein the floating conductive pattern extends continuously along a portion of an upper surface and a lateral surface of the protruding region of the first semiconductor layer.

19. The semiconductor light emitting device as claimed in claim 15, wherein the first and second conductive patterns and the floating conductive pattern have a same thickness as measured along a direction normal to an upper surface of the first semiconductor layer.

* * * * *